(12) United States Patent
Nestler et al.

(10) Patent No.: US 9,218,318 B2
(45) Date of Patent: Dec. 22, 2015

(54) ANALOG COMPUTATION

(75) Inventors: Eric Nestler, Harvard, MA (US); Vladimir Zlatkovic, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 406 days.

(21) Appl. No.: 13/482,112

(22) Filed: May 29, 2012

(65) Prior Publication Data

US 2013/0080497 A1    Mar. 28, 2013

Related U.S. Application Data

(63) Continuation of application No. 12/545,590, filed on Aug. 21, 2009, now Pat. No. 8,188,753.

(60) Provisional application No. 61/153,574, filed on Feb. 18, 2009.

(51) Int. Cl.
| | | |
|---|---|---|
| G01R 27/26 | (2006.01) | |
| G06F 17/14 | (2006.01) | |
| G06G 7/19 | (2006.01) | |
| G01D 5/24 | (2006.01) | |
| G01R 31/02 | (2006.01) | |

(52) U.S. Cl.
CPC ............ *G06F 17/14* (2013.01); *G01R 27/2605* (2013.01); *G06G 7/19* (2013.01); *G01D 5/24* (2013.01); *G01R 31/028* (2013.01)

(58) Field of Classification Search
CPC ...... G06F 17/14; G06G 7/19; G01R 27/2605; G01R 31/028
See application file for complete search history.

(56) References Cited

U.S. PATENT DOCUMENTS

| 4,077,035 A | 2/1978 | Yee |
| 4,399,426 A | 8/1983 | Tan |
| 4,551,686 A | 11/1985 | Benzinger |

(Continued)

FOREIGN PATENT DOCUMENTS

| DE | 102006015762 | 10/2007 |
| EP | 0933870 | 8/1999 |

(Continued)

OTHER PUBLICATIONS

D'Mello, Design Approaches to Field-Programmable Analog Integrated Circuits, Analog Integrated Circuits and Signal Processing, 1998.

(Continued)

*Primary Examiner* — Jermele M Hollington
(74) *Attorney, Agent, or Firm* — Patent Capital Group

(57) ABSTRACT

Some general aspects of the invention relate to a circuit and to a method for analog computation, for example, using switched capacitor integrated circuits. In some examples, a circuit includes a first group of capacitors and a second group of capacitors that may store charges during circuit operation. The first and/or the second group of capacitors may include multiple disjoint subsets of capacitors. An input circuit is provided for receiving a set of input signals and for inducing a charge on each of some or all capacitors in the first group of capacitors according to a corresponding input signal. Switches, for example, transistors controlled by a sequence of clock signals, are used to couple different sets of capacitors. Different configurations of the switches are used to form different sets of the capacitors among which charge can redistribute.

20 Claims, 19 Drawing Sheets

(56) References Cited

U.S. PATENT DOCUMENTS

| | | | |
|---|---|---|---|
| 5,235,335 | A | 8/1993 | Hester |
| 5,369,407 | A | 11/1994 | Yung et al. |
| 5,581,252 | A | 12/1996 | Thomas |
| 5,684,478 | A | 11/1997 | Panaoussis |
| 5,912,584 | A * | 6/1999 | Iizuka .................. 330/85 |
| 6,054,945 | A | 4/2000 | Doyle |
| 6,414,541 | B1 | 7/2002 | Arvidsson |
| 6,529,015 | B2 * | 3/2003 | Nonoyama et al. .......... 324/678 |
| 6,586,943 | B1 * | 7/2003 | Masuda et al. ................ 324/500 |
| 6,859,762 | B2 | 2/2005 | Mawet et al. |
| 7,199,740 | B1 | 4/2007 | Ferguson, Jr. |
| 7,405,681 | B2 | 7/2008 | Jonsson et al. |
| 7,539,721 | B2 | 5/2009 | Belveze et al. |
| 7,791,407 | B2 | 9/2010 | Muhammad et al. |
| 7,804,434 | B2 | 9/2010 | Stoutjesdijk |
| 7,965,135 | B2 | 6/2011 | Yoshizawa et al. |
| 8,067,972 | B2 | 11/2011 | Iida et al. |
| 8,188,753 | B2 * | 5/2012 | Nestler et al. ................ 324/658 |
| 8,547,272 | B2 * | 10/2013 | Nestler et al. ................ 341/172 |
| 8,717,094 | B2 * | 5/2014 | Nestler et al. ................ 327/551 |
| 2001/0019273 | A1 * | 9/2001 | Nonoyama et al. .......... 324/678 |
| 2003/0018452 | A1 | 1/2003 | Mawet |
| 2003/0050027 | A1 | 3/2003 | Muhammad |
| 2006/0269312 | A1 | 11/2006 | Muraishi |
| 2008/0048781 | A1 | 2/2008 | Wagner |
| 2008/0057900 | A1 | 3/2008 | Fang et al. |
| 2008/0129573 | A1 | 6/2008 | Mueck et al. |
| 2009/0002066 | A1 | 1/2009 | Lee |
| 2009/0322580 | A1 | 12/2009 | Belveze et al. |
| 2010/0198898 | A1 | 8/2010 | Pan |
| 2010/0207644 | A1 * | 8/2010 | Nestler et al. ................ 324/658 |
| 2010/0223225 | A1 | 9/2010 | Vigoda et al. |
| 2010/0225419 | A1 | 9/2010 | Pan |
| 2012/0306569 | A1 * | 12/2012 | Nestler et al. ................ 327/551 |
| 2013/0207827 | A1 * | 8/2013 | Nestler et al. ................ 341/172 |

FOREIGN PATENT DOCUMENTS

| | | |
|---|---|---|
| EP | 1018806 | 7/2000 |
| TW | 1490786 | 7/2015 |

OTHER PUBLICATIONS

Martinez, Discrete Time Filters, Wiley 1999.

Rivet, A 65nm CMOS RF Front End Dedicated to Software Radio in Mobile Terminals, Proc. SDR 2008.

Lacy, Cameron B., "Design of a Programmable Switched-Capacitor Analog FIR Filer," [online: retrieved Nov. 14, 2012 https://tspace.library.utoronto.ca/bitstream/1807/14967/1/MQ46200.pdf] XP55044242 (1999).

* cited by examiner

With two Compensation capacitors (both $e_1$ & $g_1$)

Ph1: induce charge on $c_{11}$, $c_{12}$
Ph2a: redistribute charge overn $c_{11}$ $c_{12}$ $e_1$ $g_1$ $d_{11}$ $d_{21}$ effective circuit:

further reduction:

Total charge divided on two capacitors yields:

$$v_0 = \frac{x_0 \cdot c_{11} + x_2 \cdot c_{12}}{c_{11}+c_{12}+e_1 + \dfrac{1}{\dfrac{1}{g_1}+\dfrac{1}{d_{11}+d_{21}}}}$$

Voltage $z_0$ can be obtained as a fraction at $v_0$ by voltage division $$v_0 \;—\!\!|g_1|\!\!—\; z_0 \;—\!\!|d_{11}+d_{21}|\!\!—\;\downarrow$$

$$\therefore z_0 = v_0 \cdot \frac{g_1}{g_1 + d_1 + d_{21}}$$

$$= \frac{x_0 \cdot c_{11} + x_2 \cdot c_{12}}{c_{11} + c_{12} + e_1 + \dfrac{1}{\dfrac{1}{g_1} + \dfrac{1}{d_{11}+d_{21}}}} \cdot \frac{g_1}{g_1 + d_{11} + d_{21}}$$

$$= \frac{g_1 \cdot (x_0 \cdot c_{11} + x_2 \cdot c_{12})}{(g_1 + d_{11} + d_{21})(c_{11} + c_{12} + e_1) + g_1(d_{11} + d_{21})}$$

ANALOG COMPUTATION

CROSS-REFERENCE TO RELATED APPLICATIONS

This Application is a continuation of U.S. Pat. No. 8,188,753, issued on May 29, 2012, which claims the benefit of U.S. Provisional Application Ser. No. 61/153,574, filed Feb. 18, 2009. The contents of the above applications are incorporated herein by reference in their entirety.

STATEMENT AS TO FEDERALLY SPONSORED RESEARCH

This invention was made with government support under contract FA8750-07-C-0231 awarded by the Defense Advanced Research Projects Agency (DARPA). The government has certain rights in the invention.

BACKGROUND

This application relates to analog computation, for example, using analog electronics to compute algebraic functions such as the Fourier transform.

The Fourier transform and many other forms of mathematical operations are widely used in a number of electrical engineering and signal processing applications, for example, to provide signal conversions between the time domain and the frequency domain and to implement time-domain or frequency-domain filters of various types. Many existing techniques to carry out those computations make use of digital signal processors (DSP), in which case variables are represented and processed as discrete-valued signals. Some other techniques to implement those computations make use of analog circuits, such as using resistor-based current summation circuits to achieve summations and multiplications.

SUMMARY

Some general aspects of the invention relate to a circuit and to a method for analog computation, for example, using switched capacitor integrated circuits.

In some examples, a circuit includes a first group of capacitors and a second group of capacitors that may store charges during circuit operation. The first and/or the second group of capacitors may include multiple disjoint subsets of capacitors. An input circuit is provided for receiving a set of input signals and for inducing a charge on each of some or all capacitors in the first group of capacitors according to a corresponding input signal. Switches, for example, transistors controlled by a sequence of clock signals, are used to couple different sets of capacitors. Different configurations of the switches are used to form different sets of the capacitors among which charge can redistribute.

In some embodiments, the switches are configured to be operative in various configurations, including without limitation in each of the following three configurations. In a first switch configuration, a charge is induced on each capacitor in the first group of capacitors according to a corresponding input signal. In a second switch configuration, a number of sets of capacitors are formed. Each set of capacitors in this second configuration includes at least one capacitor from the first group of capacitors and one capacitor from the second group of capacitors. In a third switch configuration, different sets of capacitors are formed. Each set of capacitors in this third configuration includes a corresponding disjoint subset of the second group of capacitors.

An output circuit is provided for determining output signals. In some examples, each output signal may be determined according to a charge on a capacitor in a corresponding set of capacitors formed in the third switch configuration.

In some other examples, the circuit includes a first group of capacitors that have multiple disjoint subsets of capacitors. Switches are configured to be operative in at least two configurations, including without limitation, a first configuration for inducing charges on respective capacitors in the first group of capacitors according to a corresponding one of the input signals, and a second configuration for forming a number of sets of capacitors among which charge may redistribute. Each formed set of capacitors includes a corresponding disjoint subset of the first group of capacitors and an additional capacitor not from the first group of capacitors. The total capacitance of capacitors in each formed set of capacitors may be selected to be equal to one or more constant values.

In some further examples, more than two groups of capacitors are used, and in each successive configuration of the switches, sets of capacitors are formed with each set including capacitors from two groups of capacitors.

In some examples, at least some sets of capacitors formed by switches each include a capacitor not in the first or the second group of capacitors. For instance, some formed sets of capacitors each includes a compensation capacitor switchably coupled in series with at least one capacitor from the first group and with at least one capacitor from the second group. Some formed sets of capacitors each includes a compensation capacitor switchable coupled in parallel with at lest one capacitor from the first group of capacitors. Some formed sets of capacitors each includes a gain buffered coupled between the first and the second groups of capacitors.

Another aspect of the invention relates to a circuit having a first group of capacitors, a second group of capacitors, an input circuit configured for accepting a set of input signals and switches for forming sets of capacitors among which charge may redistribute. The switches are configurable in at least three configurations including: a first configuration for inducing a charge on each capacitor in the first group of capacitors according to a corresponding one of the input signals; a second configuration for forming a first plurality of sets of capacitors, each set of capacitors including at least one capacitor from the first group of capacitors and one capacitor from the second group of capacitors, and a third configuration for forming a second plurality of sets of capacitors, each set in the second plurality of sets of capacitors including a corresponding disjoint subset of the second group of capacitors. An output circuit is configured for determining output signals each according to a charge on a capacitor in a corresponding set of the second plurality of sets of capacitors.

Another aspect relates to a circuit having an input circuit configured for accepting a set of input signals, a first group of capacitors, and switches for forming sets of capacitors among which charge may redistribute. The switches are configurable in at least two configurations including a first configuration for inducing, for each capacitor in the first group of capacitors, a charge according to a corresponding one of the input signals; and a second configuration for forming a plurality of sets of capacitors, each set of capacitors including a corresponding disjoint plurality of the first group of capacitors and at least one capacitor not from the first group of capacitors, An output circuit is provided for determining output signals, each output signal being determined according to a charge on a capacitor in a corresponding set of the plurality of sets of capacitors.

Another aspect relates to a method for analog computation in a device having a group of storage sections each section having a respective group of capacitors. The method includes inducing charges on respective capacitors in an initial storage section, each induced charge being determined by a corresponding input signal. In each of one or more successive processing stages, a pair of storage sections is formed for charge redistribution by switchably coupling capacitors from the corresponding pair of storage sections to form a group of one or more sets of capacitors among which charge redistributes. Output signals are determined according to charges on capacitors in a final storage section. In some examples, the final storage section is not necessarily different from the initial storage section.

Another aspect relates to an integrated circuit having a set of two or more storage sections, each storage section having a group of capacitors for storing charge. A configurable circuitry is coupled to the storage sections for enabling charge redistribution among capacitors in different storage sections. The configurable circuitry includes a group of switches each being coupled to at least two capacitors each capacitor from a different storage section. A control logic is provided for configuring the configurable circuitry to form a respective pair of storage sections in each of one or more successive processing stages, including in each stage, selectively activating subsets of switches in the configurable circuitry to couple capacitors from a formed pair of storage sections to form a group of one or more sets of capacitors among which charge redistributes.

Some further aspects relate to methods and techniques for implementing a configurable analog computation module that is architecturally analogous to a field-programmable gate array (FPGA). This analog computation module may include two or more storage sections each having a group of capacitors, and a configurable network of interconnects that allows subsets of capacitors from different storage sections to be "wired" together. External data may be provided to dynamically or statically define sets of interconnects between the capacitors from different storage sections in order to form sets of capacitors among which charge distributes. The capacitance of the capacitors in the storage sections and the interconnects are selected based on the particular algebraic functions that the circuit is designed to implement.

There may be various applications in which the circuit and method described herein may be useful. For example, the circuit may be used to process a set of input signals (e.g., voltage signals) to generate output signals that are representations of algebraic functions of the input signals. One particular application relates to implementing Discrete Fourier Transform (DFT) in an analog circuit domain, as described in detail at a later section of this document.

Embodiments may include one or more of the following advantages.

Analog computation can be useful in many signal processing applications. Compared with their digital equivalents, analog signal processors can directly process data in the form of continuous-valued analog signals, without necessarily requiring the use of analog-to-digital converters (ADC) and digital-to-analog converters (DAC), which can be both expensive and slow in speed. Also, analog technology can be used in integrated circuits for designing processors with improved performance in power efficiency, area efficiency, and speed of processing. By handling signals in complete analog domain, such processors can be used to perform fast and complex filtering in real time.

Other features and advantages of the invention are apparent from the following description, and from the claims.

DETAILED DESCRIPTION

1 Overview

The following description includes discussion of various circuits (e.g., switched capacitor integrated circuits) that implement discrete-time analog computations in which variables are processed in the form of continuous-valued signals. For the purpose of brevity and without limitation, some design approaches are illustrated below in the context of implementing computations that can be adapted to perform Fourier transform—a particular type of computation that has a wide range of applications in various areas of signal processing. It should be clearly understood that other computations can be implemented using the approaches described below.

Generally, the Discrete Fourier Transform applies mathematical operations to transform a signal in one domain (e.g., in a discrete time domain) to a signal in another domain (e.g., in a frequency domain). When applied to discrete-time sampled data, the DFT produces a set of outputs each of which is a weighted summation of the sampled data, as represented by:

$$y_k = \frac{1}{N} \cdot \sum_{n=0}^{N-1} x_n W_N^{nk} \qquad (1)$$

where $x_n$ are the discrete sampled data, $y_k$ are the resulting transform output, N is an integer, and $W_N^{nk}$ is defined as $e^{-j2\pi nk/N}$.

Figure 1:
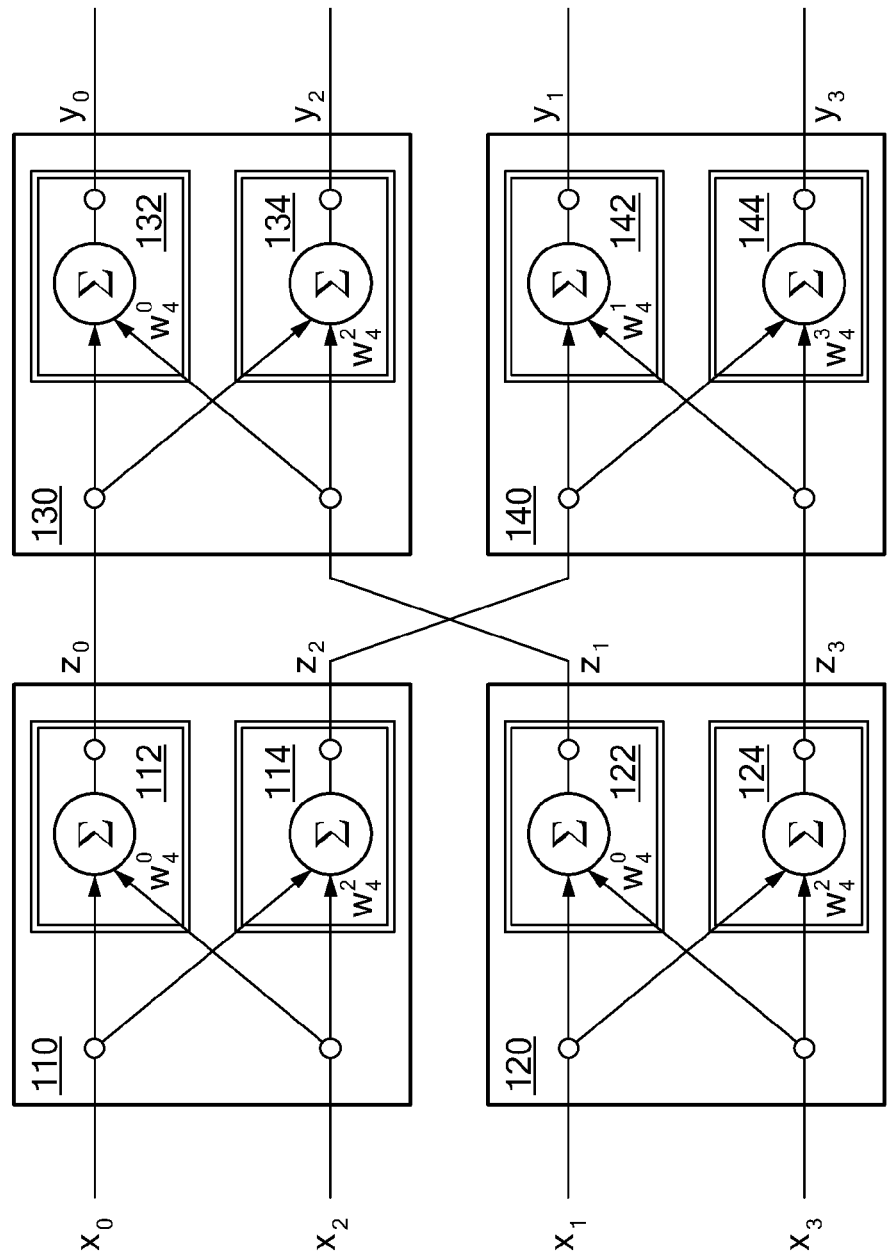
FIG. 1 shows a computation structure, which can be used to implement a 4-point DFT.

FIG. 1 shows a computation structure, which can be used to implement a 4-point DFT of equation (1) using a radix-2 decimation-in-time 4-point Fast Fourier Transform (FFT). According to this particular FFT technique, four input data points $x_0$, $x_1$, $x_2$, and $x_3$ are first processed in a first group of summer circuits 112, 114, 122, and 124, which generate a set of intermediate outputs $z_0$, $z_1$, $z_2$, and $z_3$ as shown below:

$$z_0 = a_{00} \cdot x_0 + a_{02} \cdot x_2; \quad (1a)$$

$$z_2 = a_{20} \cdot x_0 + a_{22} \cdot x_2; \quad (1b)$$

$$z_1 = a_{11} \cdot x_1 + a_{13} \cdot x_3; \quad (1c)$$

$$z_3 = a_{31} \cdot x_1 + a_{33} \cdot x_3; \quad (1d)$$

Here, each intermediate output $z_m$ is a weighted summation of a respective pair of input data points $x_n$, and $a_{mn}$ represents a set of weight coefficients from $x_n$ to $z_m$.

Subsequently, the intermediate outputs of the summer circuits 112, 114, 122, and 124 are processed in a second group of summer circuits 132, 134, 142, and 144, which then generates the transform outputs $y_0$, $y_1$, $y_2$, and $y_3$ according to the following:

$$y_0 = b_{00} \cdot z_0 + b_{01} \cdot z_1; \quad (1e)$$

$$y_2 = b_{20} \cdot z_0 + b_{21} \cdot z_1; \quad (1f)$$

$$y_1 = b_{12} \cdot z_2 + b_{13} \cdot z_3; \quad (1g)$$

$$y_3 = b_{32} \cdot z_2 + b_{33} \cdot z_3; \quad (1h)$$

Here, each output data point $y_p$ is a weighted summation of a respective pair of the intermediate outputs $z_q$, and $b_{pq}$ represents a set of weight coefficients from $z_q$ to $y_p$.

With proper selection of coefficients $a_{mn}$ and $b_{pq}$, the two-stage computation described above yields a set of outputs $y_0$, $y_1$, $y_2$, and $y_3$, each of which is a weighted summation of inputs $x_0$, $x_1$, $x_2$, and $x_3$ that satisfies equation (1). For example, output $y_0$ becomes:

$$y_0 = a_{00} \cdot b_{00} \cdot x_0 + a_{11} \cdot b_{01} \cdot x_1 + a_{02} \cdot b_{00} \cdot x_2 + a_{13} \cdot b_{01} \cdot x_3,$$

with each product of $a_{mn} \cdot b_{pq}$ corresponding to a $$\frac{1}{N} \cdot W_N^{nk}$$

term of equation (1), or another scaled version of the $W_N^{nk}$ term.

The following sections provide several circuit examples that implement the two-stage computation described above. In those examples, very generally, each of the eight weighted summations (1a) to (1h) shown in FIG. 1 is implemented by a summer circuit that is configured using switched capacitor techniques. Note that, in some examples such as implementation of a DFT, in these eight weighted summations, coefficients $a_{mn}$ and $b_{pq}$ may include real positive numbers, real negative numbers, and complex numbers. For purposes of illustration, the first set of examples described below has the same form of transformation expressed in equations (1a)-(1h) but assumes that all of the coefficients $a_{mn}$ and $b_{pq}$ have real positive values. Related circuits that are capable of implementing weighted summations with negative and complex coefficients, for example, for the DFT, are described in a later section of this document.

2 Analog Computation with Positive Coefficients 2.1 Example 1

Figure 2:
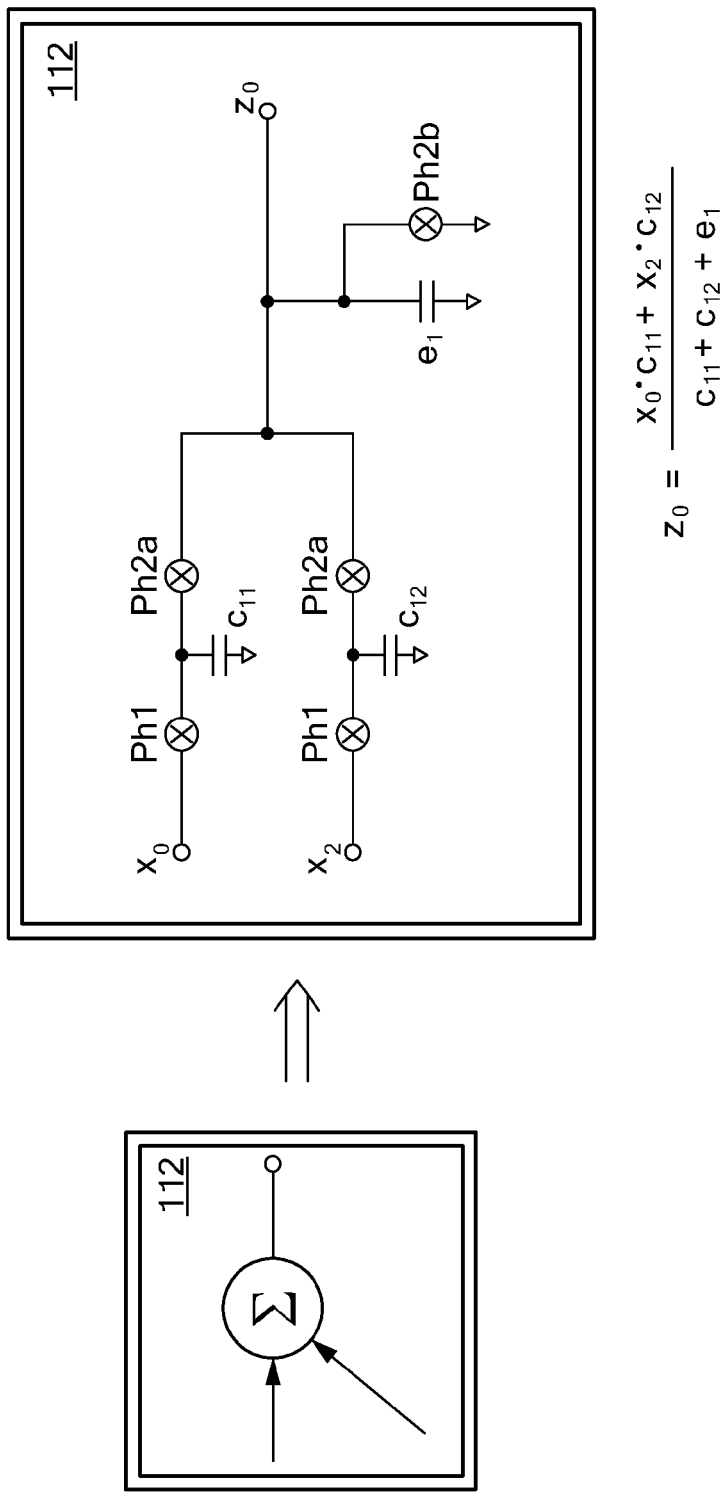
FIG. 2 shows one embodiment of a weighted summation circuit of FIG. 1.

FIG. 2 shows one example of the summer circuit 112 configured using switched capacitor techniques. In this example, the summer circuit includes a set of two sampling capacitors $c_{11}$ and $c_{12}$, and optionally a compensation capacitor $e_1$ switchably coupled in parallel to the sampling capacitors. Two voltage signals $x_0$ and $x_2$ are provided as input to the circuit 112. During clock phase ph1, sampling capacitors $c_{11}$ and $c_{12}$ are charged to the input voltages $x_0$ and $x_2$, respectively (for notational simplicity, each capacitor is labeled with its capacitance). The amount of charge stored on $c_{11}$, for example, equals $x_0 \cdot c_{11}$. During clock phase ph2a (and with switches ph1 off), sampling capacitors $c_{11}$ and $c_{12}$ are disconnected from the input $x_0$ and $x_2$, and the total charge (i.e., $x_0 \cdot c_{11} + x_2 \cdot c_{12}$) previously stored on the two capacitors are redistributed among a set of capacitors including $c_{11}$, $c_{12}$, capacitors in a succeeding circuit (if any) connected to $c_{11}$ and $c_{12}$, and the compensation capacitor $e_1$. In the absence of any succeeding circuit, the output voltage of this summer circuit 112, i.e., the voltage across capacitor $e_1$, becomes:

$$z_0 = \frac{x_0 \cdot c_{11} + x_2 \cdot c_{12}}{c_{11} + c_{12} + e_1} \quad (2)$$

which is effectively a weighted sum of the two inputs of the circuit, with weight coefficients being dependent on the denominator $c_{11} + c_{12} + e_1$ of equation (2).

Note that equation (2) assumes that $e_1$ is uncharged at the onset of ph2a. This is accomplished by using ph2b to discharge $e_1$ to zero, for example, at some time after ph2a ends but before the next ph1 starts, or to discharge $e_1$ to a constant charge level, which would then add a constant term to the numerator of equation (2).

Figure 3:
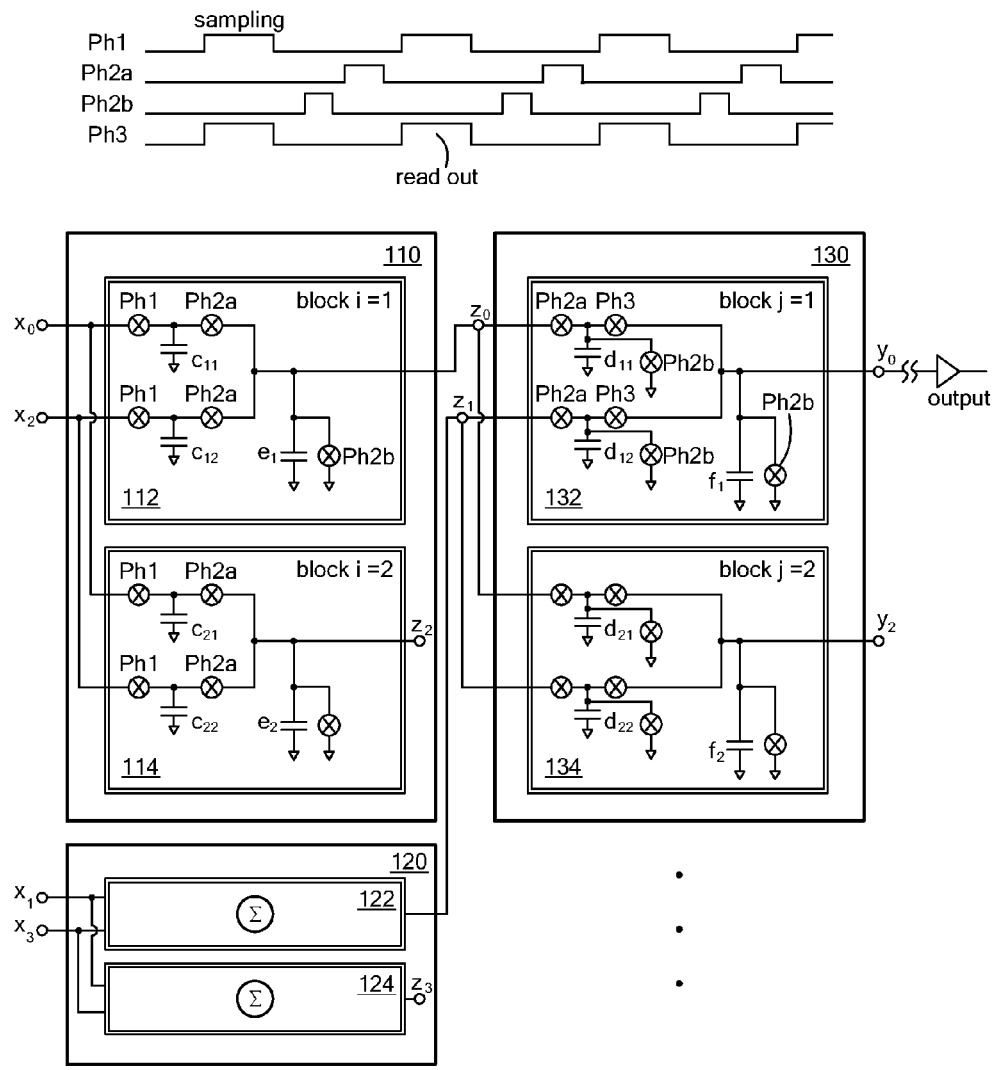
FIG. 3 is a detailed circuit diagram of the computation structure shown in FIG. 1 with exemplary clock phases.

FIG. 3 shows one circuit embodiment of the computation structure shown in FIG. 1, which is implemented based on the summer circuit 112 illustrated in FIG. 2. Here, each of the first group of summer circuits 112, 114, 122, and 124 (also referred to as input blocks, indexed by i) includes a pair of sampling capacitors (e.g., $c_{11}$ and $c_{12}$) that receives a selected pair of input signals (e.g., $x_0$ and $x_2$) and a compensation capacitor (e.g., $e_1$) that is switchably coupled to the sampling capacitors. These input blocks generate a set of intermediate outputs $z_0$, $z_1$, $z_2$, and $z_3$, which are subsequently provided to the second group of summer circuits 132, 134, 142 and 144 (see FIG. 1 and also referred to as output blocks, indexed by j). For example, after the end of ph2a phase, the output of circuit 112 is $$z_0 = \frac{x_0 \cdot c_{11} + x_2 \cdot c_{12}}{c_{11} + c_{12} + e_1 + d_{11} + d_{21}}.$$

The output of circuit 122 is $$z_1 \approx \frac{x_1 \cdot c_{31} + x_2 \cdot c_{32}}{c_{31} + c_{32} + e_3 + d_{12} + d_{22}}.$$

Those two signals $z_0$ and $z_1$, are provided to circuit 132 for further summation.

Each output block j includes a pair of sampling capacitors (e.g., $d_{11}$ and $d_{12}$ in block 132) that receives a selected pair of intermediate outputs (e.g., $z_0$ and $z_1$) and a compensation capacitor (e.g., $f_1$) that is switchably coupled to the sampling capacitors. The output $y_0$ of block 132 is therefore a weighted summation of $z_0$ and $z_1$, i.e., $$y_0 \approx \frac{z_0 \cdot d_{11} + z_1 \cdot d_{12}}{d_{11} + d_{12} + f_1}$$

as a result of circuit analysis similar to the one conducted for circuit 112.

In this description, capacitors $c_{ik}$ are labeled consistently for all input blocks i (i.e., $c_{ik}$ is the $k^{th}$ capacitor in input block i) and are also referred to as the first group of capacitors. Similarly, capacitors $d_{jk}$ are labeled consistently for all output blocks j (i.e., $d_{jk}$ is the $k^{th}$ capacitor in output block j) and are also referred to as the second group of capacitors. In addition, each compensation capacitor $e_i$ is respectively associated with input block i, and each compensation capacitor $f_j$ is respectively associated with output block j.

In some examples, circuit design for the computation can be simplified, for instance, by selecting a set of sampling capacitors whose respective capacitance is in proportion to appropriate coefficients $a_{mn}$ and $b_{pq}$ determined from equation (1a)-(1h). Because the output of each summer circuit is also scaled by its cumulative capacitance (e.g., the denominator of equation (2)), the compensation capacitors $e_1$, $e_2$, $e_3$, and $e_4$ are selected with suitable capacitance to ensure that the inputs to a succeeding circuit (e.g., summer 132) are scaled as desired, for example, that $c_{11}+c_{12}+e_1$ is equal to $c_{31}+c_{32}+e_3$, say $K^{(1)}$. In addition, to further reduce the attenuation caused by the input capacitance of the second group of summer circuits such as circuit 132, sampling capacitors such as $d_{11}$ used in circuit 132 may be selected at a capacitance smaller than $c_{11}+c_{12}+e_1$.

In some examples, $$K^{(1)} = \sum_k c_{ik} + e_i + \sum_k d_{ki}$$

is constant for all input blocks i (such as blocks 112 and 114) and $$K^{(2)} = \sum_k d_{jk} + f_j$$

is constant for all output blocks j (such as blocks 132 and 134). With selection of the compensation capacitors in this way, the output voltages from the first stage have the same form, for example, $$z_0 = \frac{x_0 \cdot c_{11} + x_2 \cdot c_{12}}{K^{(1)}} \text{ and } z_1 = \frac{x_1 \cdot c_{31} + x_2 \cdot c_{32}}{K^{(1)}}.$$

In some other examples, compensation capacitors such as $e_1$, $e_2$ and $f_1$, $f_2$ may not be necessarily used in the circuit. For instance, in circuits where only two groups of capacitors (including a first group $c_{11}$, $c_{12}$, $c_{21}$, $c_{22}$, $c_{31}$, $c_{32}$, ... and a second group $d_{11}$, $d_{12}$, $d_{21}$, $d_{22}$, $d_{31}$, $d_{32}$, ...) are used, the respective value of each capacitor may be analytically determined according to the coefficients $a_{mn}$ and $b_{pq}$ of equation (1a)-(1h). Similar analysis is also applicable to circuits having more than two groups of capacitors.

There may be various approaches to designing a sequence of clock phases for operating the circuit of FIG. 3. Referring now to FIGS. 4A-4D, one design approach uses three primary clock phases ph1, ph2a, and ph3 that are configured to set the switches in three different configurations respectively for input sampling, charge redistribution, and readout. In addition to these three primary clock phases, a fourth clock phase ph2b is also provided for maintaining a constant (e.g., zero) charge "memory" on some of the capacitors in the circuit throughout various cycles of circuit operation. In the following description, each clock phase is illustrated in greater detail.

Figure 4A:
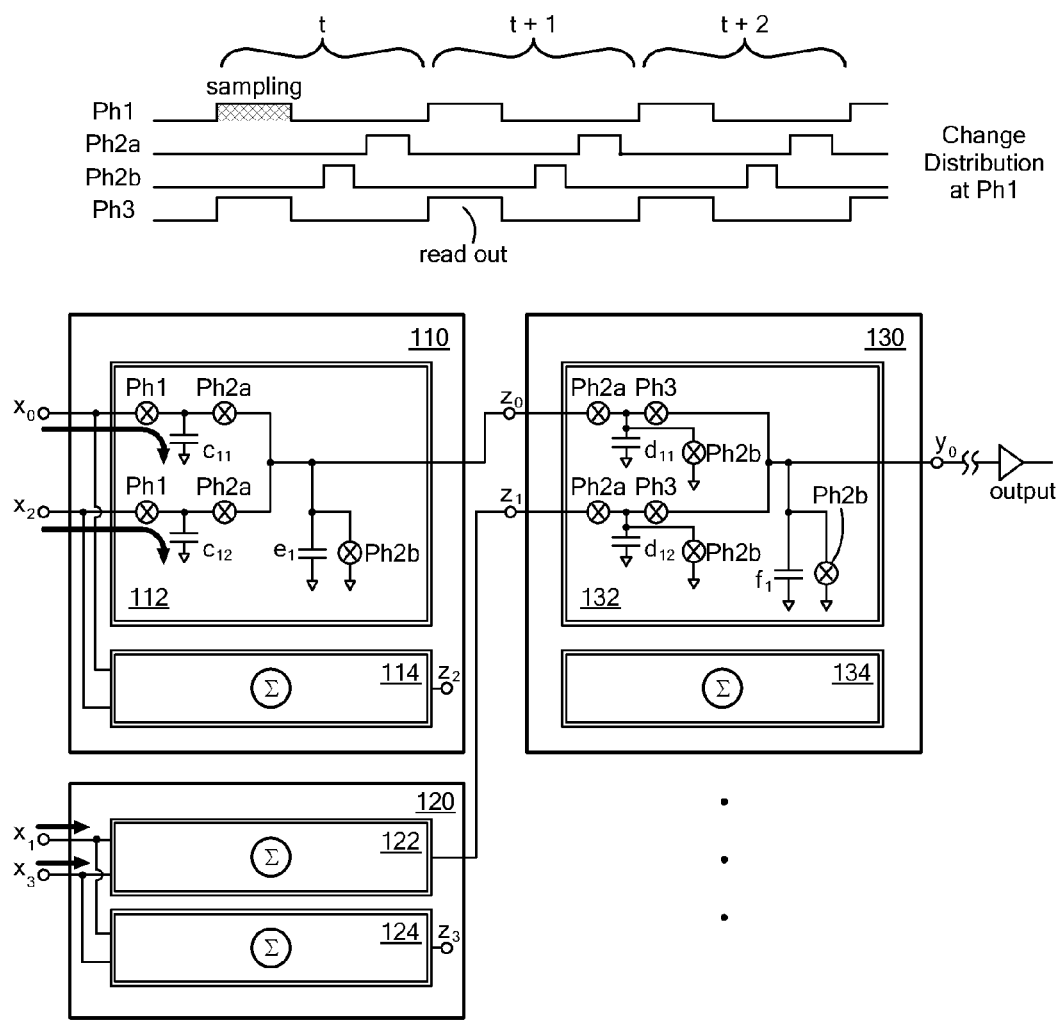
FIGS. 4A-4D illustrate the charge distribution of the circuit of FIG. 3 in respective clock phases.

Referring to FIG. 4A, in the first switch configuration, clock ph1 is HIGH. As switches ph1 are turned on, the first group of capacitors ($c_{11}$, $c_{12}$, $c_{21}$, $c_{22}$, $c_{31}$, $c_{32}$, ...) are respectively charged according to a set of discrete voltage input values (e.g., $x_0$, $x_2$, $x_1$, $x_3$) to which the capacitor is connected. The set of voltage values may be obtained, for example, by successively sampling a continuous input voltage waveform at a sequence of sampling times (e.g., N times for an –N-input computation). In some examples, the sampling capacitors in different input blocks (e.g., blocks 112 and 122) may be loaded in sequence, whereas, in some other examples, the sampling capacitors in different input blocks may be loaded in parallel. In some other examples, a subset of the sampling capacitors may set to a constant charge instead of an input voltage.

Figure 4B:
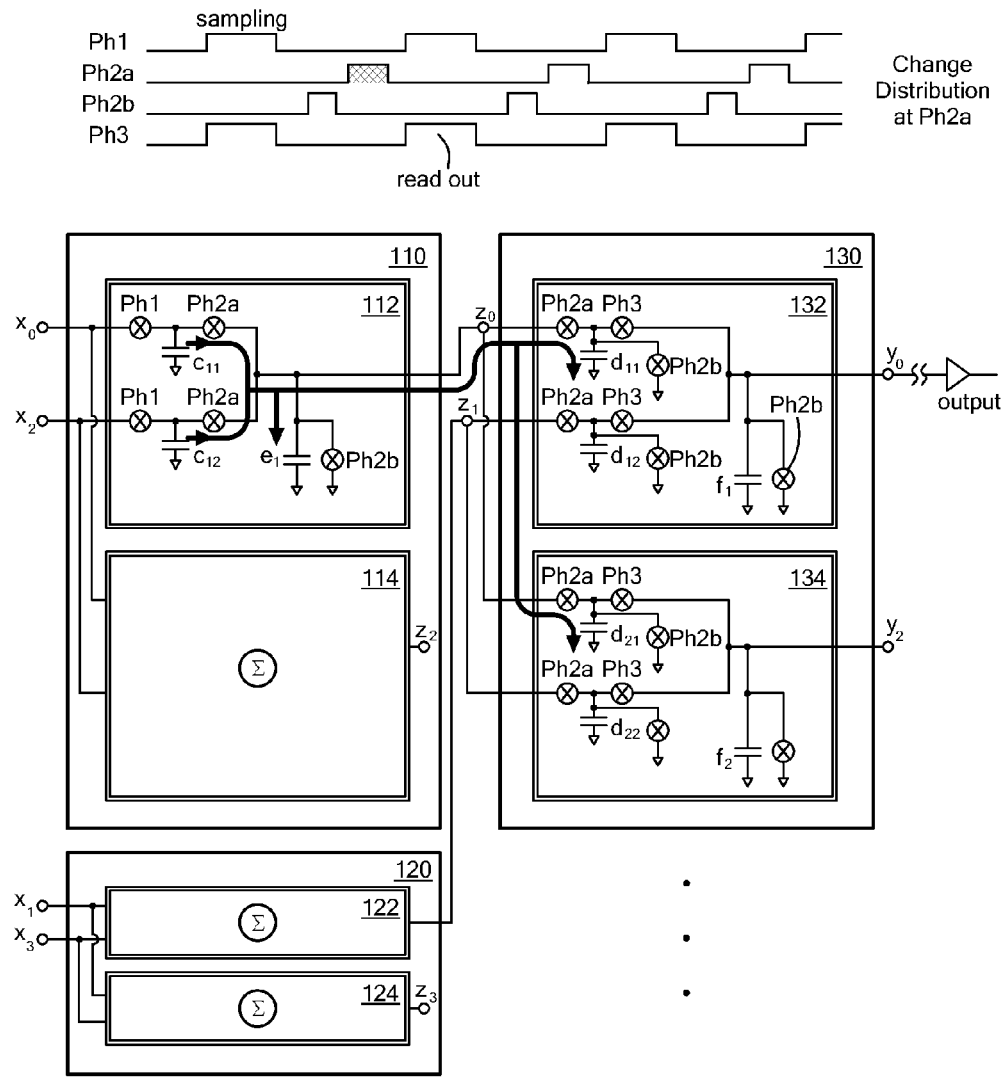

Referring to FIG. 4B, in the second switch configuration, clock ph2a is HIGH. As switches ph1 are turned off and switches ph2a are turned on, a first collection of sets of capacitors are formed. One such set of capacitors coupled by the onset ph2a includes $c_{11}$, $c_{12}$, $e_1$, $d_{11}$, and $d_{21}$. Another set includes $c_{31}$, $c_{32}$, $e_3$, $d_{12}$ and $d_{22}$. With sampling capacitors $c_{ik}$ now isolated from the input signals, charges stored on the sampling capacitors during clock ph1 are redistributed among capacitors in each set of this first group of sets of capacitors. For example, as illustrated in this figure, charges on $c_{11}$ and $c_{12}$ are redistributed among four capacitors $c_{11}$, $c_{12}$, $e_1$, $d_{11}$ and $d_{21}$ that are coupled by the onset of switches ph2a. The resulting charge on $d_{11}$ can be represented by:

$$q_{d_{11}} = \frac{x_0 \cdot c_{11} + x_2 \cdot c_{12}}{c_{11} + c_{12} + e_1 + d_{11} + d_{21}} \cdot d_{11}, \quad (3)$$

assuming $d_{11}$ and $d_{21}$ are much smaller than $c_{11}+c_{12}+e_1$. Similarly, the resulting charge on $d_{12}$ is:

$$q_{d_{12}} = \frac{x_1 \cdot c_{31} + x_3 \cdot c_{32}}{c_{31} + c_{32} + e_3 + d_{12} + d_{22}} \cdot d_{12}, \quad (4)$$

again, assuming $d_{12}$ and $d_{22}$ are much smaller than $c_{31}+c_{32}+e_3$.

If the capacitor values $e_i$ are chosen so that, for each i, $$K^{(1)} = \sum_k c_{ik} + e_i + \sum_k d_{ki},$$

then:

$$q_{d_{11}} = \frac{d_{11}}{K^{(1)}} \cdot (x_0 \cdot c_{11} + x_2 \cdot c_{12}) \quad (3a)$$

and $$q_{d_{12}} = \frac{d_{12}}{K^{(1)}} \cdot (x_1 \cdot c_{31} + x_3 \cdot c_{32}) \quad (4a)$$

Figure 4C:
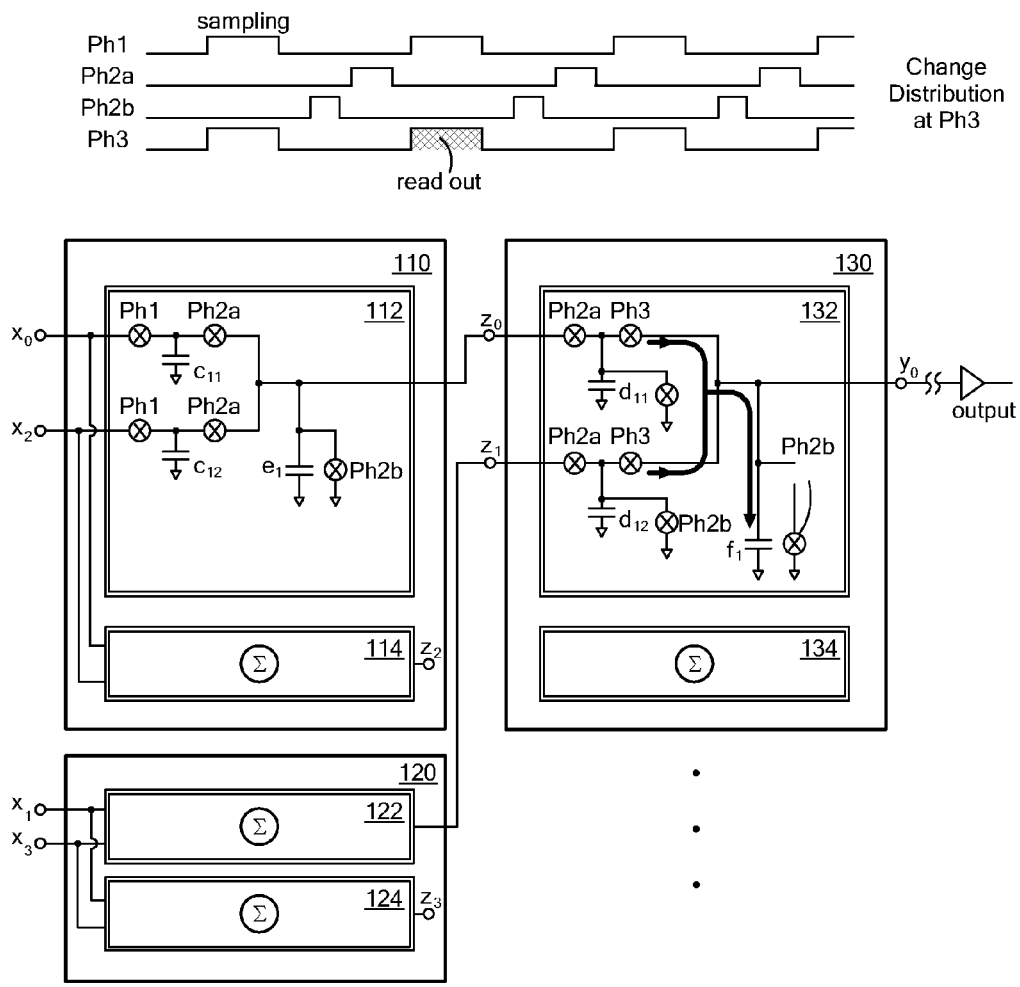

Referring to FIG. 4C, in the third switch configuration, clock ph3 is HIGH. Switches ph3 are turned on and switches ph2*a* and ph2*b* are turned off. A second collection of sets of capacitors are formed. One such set of capacitors includes $d_{11}$, $d_{12}$ and $f_1$. Another set includes $d_{21}$, $d_{22}$, and $f_2$. Charges on $d_{11}$ and $d_{12}$ are now redistributed among $d_{11}$, $d_{12}$, and $f_1$. The amount of charge stored on $f_1$ can be represented by:

$$q_{f_1} = \frac{q_{d_{11}} + q_{d_{22}}}{d_{11} + d_{12} + f_1} \cdot f_1 \quad (5)$$

Using equations (3a) and (4a), $q_{f_1}$ can be further represented by:

$$q_{f_1} = \frac{f_1}{K^{(1)} \cdot K^{(2)}} (d_{11}(x_0 \cdot c_{11} + x_2 \cdot c_{12}) + d_{12}(x_1 \cdot c_{31} + x_3 \cdot c_{32})) \quad (6)$$

where $$K^{(1)} = \sum_k c_{ik} + e_i + \sum_k d_{ki} \text{ and } K^{(2)} = \sum_k d_{jk} + f_j,$$

as previously defined.

The output signal $y_0$ of summer circuit 132 in this example is the voltage on capacitor $f_1$. This can be obtained as:

$$y_0 = v_{f_1} = \frac{q_{f_1}}{f_1} = \frac{d_{11}(x_0 \cdot c_{11} + x_2 \cdot c_{12}) + d_{12}(x_1 \cdot c_{31} + x_3 \cdot c_{32})}{K^{(1)} \cdot K^{(2)}}, \quad (7)$$

According to equation (7), $y_0$ is indeed a weighted summation of input signals $x_0$, $x_1$, $x_2$, and $x_3$ that corresponds to the values that can be obtained by equations (1a), (1c) and (1e). In addition, the weighted summation is scaled by the denominator of $K^{(1)} K^{(2)}$ product. In some implementations, this scaling may help reduce the signal dynamic range required in the circuitry.

In some examples, the output signal $y_0$ may be further provided to a cascaded group of summer circuits similar to circuits 112 and 132 for computation. In some other examples, the output signal $y_0$ may be outputted by the circuit to an external circuit, for example, through one or more gain buffers.

Figure 4D:
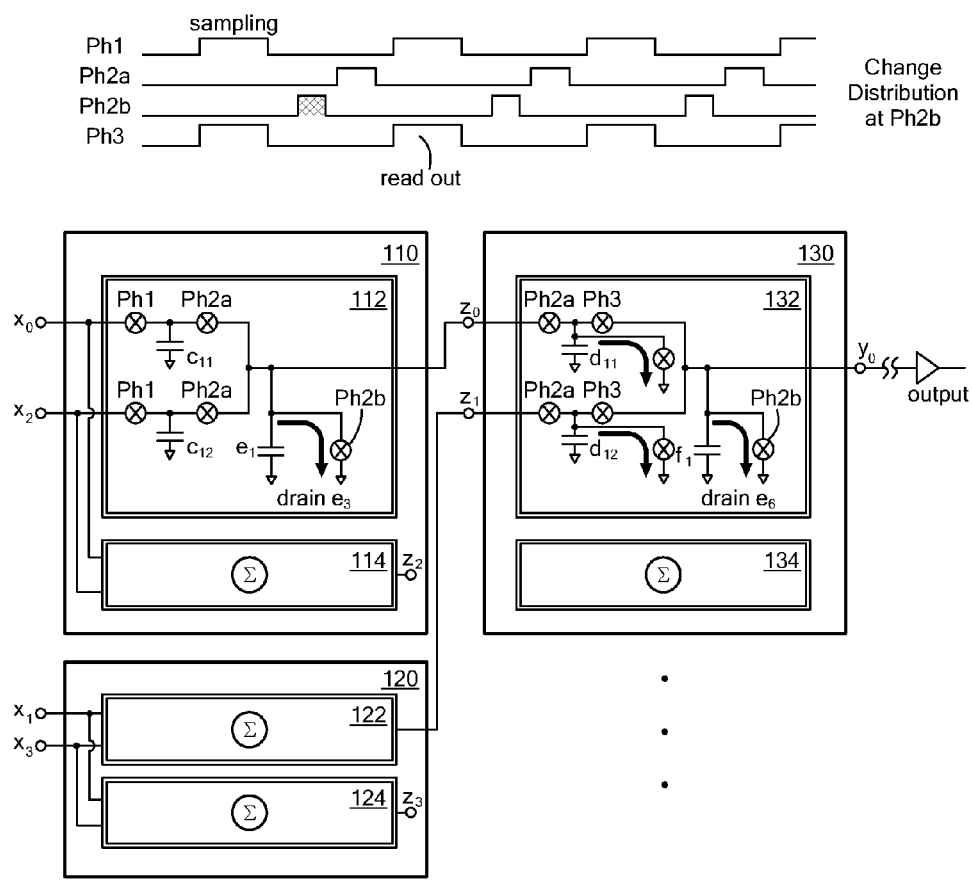

Referring now to FIG. 4D, note that in any given computation cycle t, compensation capacitors such as $e_1$ and $f_1$ are charged up during clock ph2*a*. This charge "memory" (if not properly cleared or regulated) may influence the charge redistribution during clock ph2*a* of the next computation cycle t+1. Similarly, the charge "memory" on the second group of capacitors such as $d_{11}$ and $d_{12}$ at the end of computation cycle t may also affect the charge redistribution of the next computation cycle t+1. One way to reduce these effects is to insert, in each cycle t, a clock ph2*b* that ends prior to the onset of ph2*a* so that some of the capacitors involved in charge redistribution (including compensation capacitors such as $e_1$ and $f_1$ and the second group of capacitors such as $d_{11}$ and $d_{12}$) are always discharged to either zero or some constant charge level $Q_{con}$ before charge on $c_{11}$ and $c_{12}$ redistributes at phase ph2*a*. In some examples, this constant charge level $Q_{con}$ may be adjustable (for example, through an external control) for changing the coefficients of the weighted summation or other algebraic functions that the circuit is designed to compute.

In addition to the clock design illustrated in FIGS. 4A-4D, there can be many alternative ways of clock phase configurations. In some examples, while the output signals $y_0$, $y_2$, $y_1$ and $y_3$ are generated at the end of a computation cycle, a new set of discrete sampled input signals $x_0$, $x_2$, $x_1$, $x_3$ can be simultaneously provided to the first group of summer circuits. In other words, the activation of the readout clock ph3 at cycle t may coincide with the activation of sampling clock ph1 at the next cycle t+1. In some other examples, the activation of clock ph2*b* at cycle t may be designed to coincide with the activation of sampling clock ph1 in the same cycle. Further, ph1, ph2*a*, ph2*b*, and ph3 may be implemented using multiple copies of a common signal (e.g., in the same waveform) configured by suitable amounts of propagation delays.

2.2 Example 2

Note that in the above examples, coupling the compensation capacitors $e_i$ and $f_j$ in parallel to the corresponding sampling capacitors provides one way to adjust the coefficients of the algebraic functions (e.g., equations 1(a)-1(h)) that the circuit is designed to implement. There are many alternative ways to control, either individually or collectively, the coefficients of the computations in the various summer circuits of FIG. 1.

For instance, additional compensation capacitors may be switchably coupled (in parallel, in series, or a combination of both) to the sampling capacitors of the first and the second groups of summer circuits to change the scaling of the voltage output of the corresponding summer circuits, and therefore to alter the amount of charge that is redistributed over capacitors in the subsequent circuits.

Figure 5:
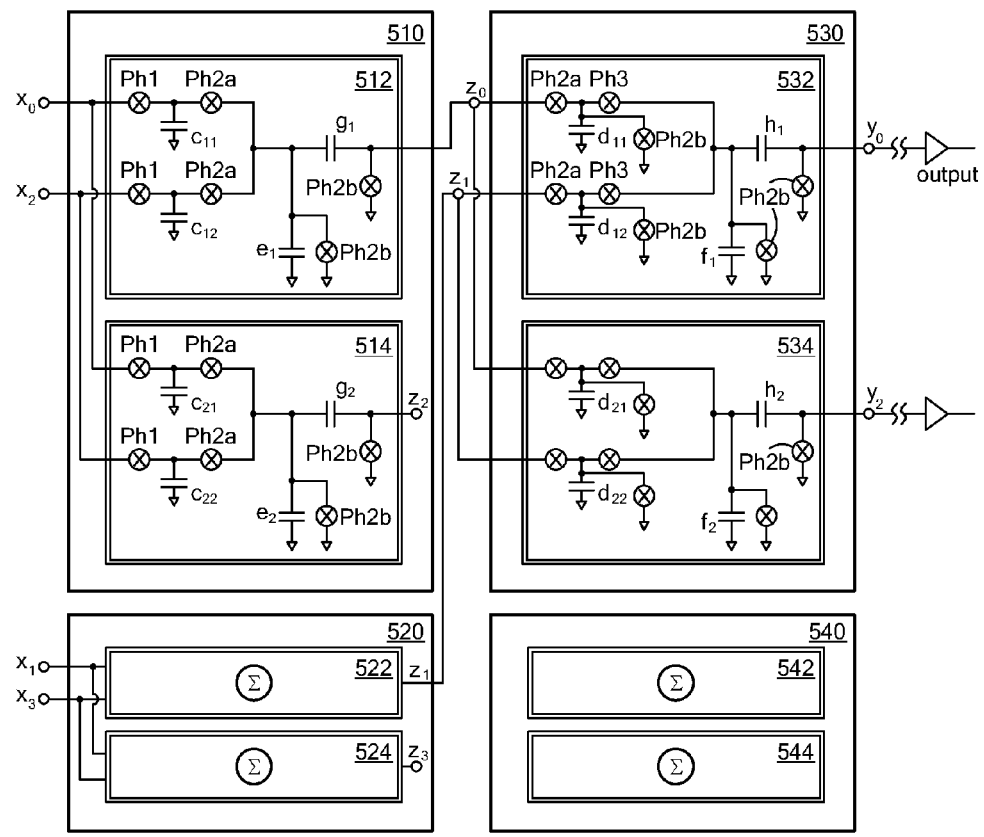
FIG. 5 shows an alternative circuit diagram of the computation structure shown in FIG. 1.

FIG. 5 shows one circuit example having a first group of summer circuits 512, 514, 522, and 524, and a second group of summer circuits 532, 534, 542, and 544 in a similar global configuration to the circuit of FIG. 3. Here, each summer circuit includes two compensation capacitors, one coupled in parallel with the sampling capacitors within the summer circuit and another one coupled in series with the sampling capacitors.

For instance, each of the first group of summer circuits includes a parallel compensation capacitor $e_i$ (as previously shown in FIG. 3), and a series compensation capacitor $g_i$. Similarly, each of the second group of summer circuits in this example (although not necessarily in other examples) includes a parallel compensation capacitor $f_j$ (also previously shown in FIG. 3), and optionally, a series compensation capacitor $h_j$. The use of those series compensation capacitors can provide to the circuit an extra degree of freedom that allows for the fine-tuning of the output of the individual summer circuits, as described in detail below.

Figure 6A:
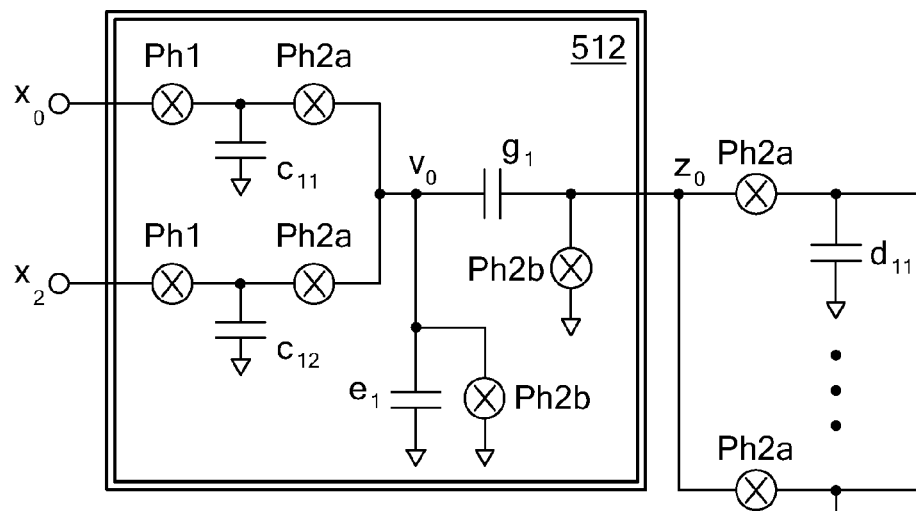
FIGS. 6A and 6B illustrate equivalent circuit derivation of a selected component of FIG. 5.
Figure 6A:
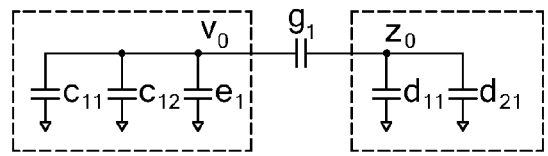
Figure 6A:
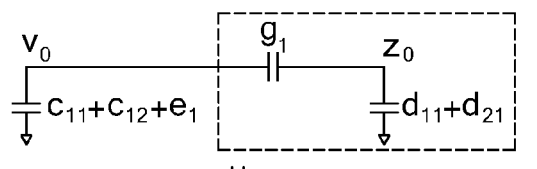
Figure 6A:
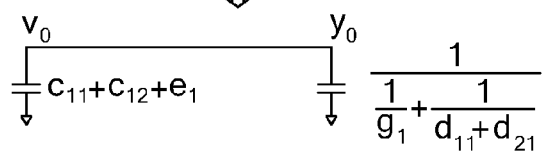
Figures 6B, 7:
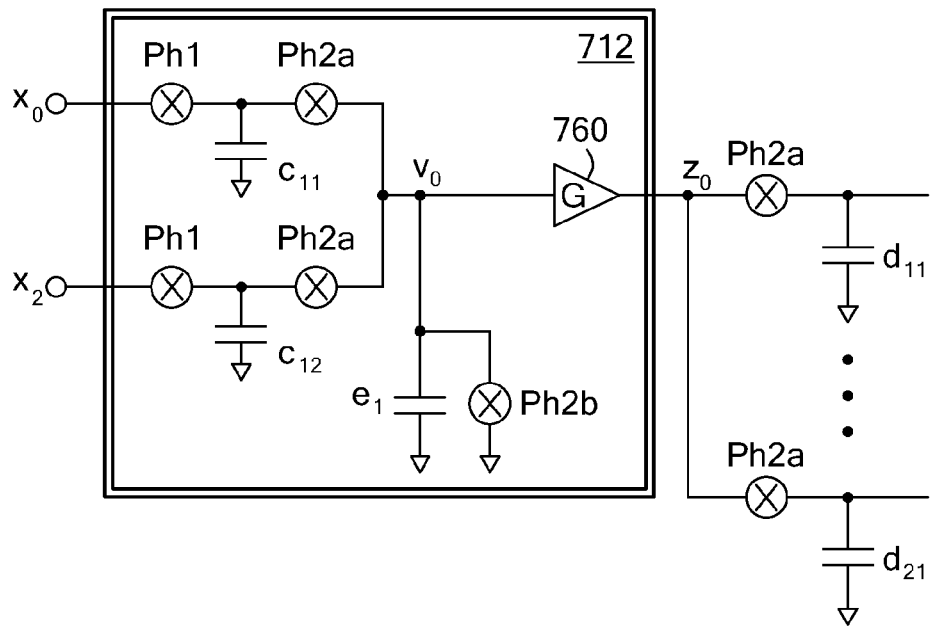
FIG. 7 shows another embodiment of the weighted summation circuit of FIG. 1.

FIGS. 6A and 6B show the effect of compensation capacitors $g_1$ on the output of summer circuit 512 by using equivalent circuit derivation. Here, summer circuit 512 accepts two input voltages $x_0$ and $x_2$ to generate an output voltage $z_0$ that is subsequently provided as input to both summer circuits 532 and 534.

Initially, at clock ph1, sampling capacitors $c_{11}$ and $c_{12}$ are charged according to input $x_0$ and $x_2$, respectively. Next, at clock ph2a, charge stored on capacitors $c_{11}$ and $c_{12}$ is redistributed over a set of capacitors, including $c_{11}, c_{12}, e_1, g_1, d_{11}$, and $d_{21}$. Using the circuit reduction technique shown in FIG. 6A, voltage $V_0$ on the compensation capacitor $e_1$ can be obtained as follows:

$$V_0 = \frac{x_0 \cdot c_{11} + x_2 \cdot c_{12}}{c_{11} + c_{12} + e_1 + \dfrac{1}{\dfrac{1}{g_1} + \dfrac{1}{d_{11} + d_{21}}}} \tag{8}$$

Correspondingly, the output voltage $z_0$ of summer circuit 512 can be computed based on voltage division, as shown below:

$$z_0 = V_0 \cdot \frac{g_1}{g_1 + d_{11} + d_{21}} \tag{9}$$

By substituting $V_0$ of equation (9) with its expression in equation (8), one can obtain:

$$z_0 = \frac{x_0 \cdot c_{11} + x_2 \cdot c_{12}}{M^{(1)}} \tag{10}$$

where denominator $M^{(1)}$ is a scaling factor equal to the product of the denominator of equations (8) and an inverse of the non-$V_0$ term of equation (9), and is a function of both $e_1$ and $g_1$. Similar analysis also applies to other summer circuits in the first or the second group of summer circuits of FIG. 5.

As shown in equation (10), the output voltage $z_0$ is a weighted summation of input $x_0$ and $x_2$, scaled by $M^{(1)}$. For some applications, it is desirable to choose the capacitance values of compensation capacitors $e_i$ and $g_i$ such that $$M^{(1)} = \left( \sum_k c_{ik} + e_i + \frac{1}{\dfrac{1}{g_i} + \dfrac{1}{\sum_k d_{ki}}} \right) \cdot \left( \frac{g_i + \sum_k d_{ki}}{g_i} \right)$$

for all each input block i. As a result, the output voltages from the first group of summer circuits can be generated on a uniform scale, for example, $$z_0 = \frac{x_0 \cdot c_{11} + x_2 \cdot c_{12}}{M^{(1)}} \text{ and } z_1 = \frac{x_1 \cdot c_{31} + x_2 \cdot c_{32}}{M^{(1)}}.$$

Note that although $M^{(1)}$ appears to depend on the various combinations of a number of variables $e_i$, $g_i$, $c_{ik}$ and $d_{ki}$, in certain circuit implementations, $M^{(1)}$ can be approximated to a simplified expression by making a few assumptions.

For instance, if compensation capacitor $g_1$ is selected to have capacitance much greater than the sampling capacitors $d_{11}$ and $d_{21}$ used in the second group of summer circuit (i.e., $g_1 \gg d_{11}+d_{12}$), and the sampling capacitors $c_{ik}$ in the first group of summer circuits have capacitance much greater than that of the sampling capacitors $d_{jk}$ in the second group of summer circuits (e.g., $c_{11}+c_{12} \gg d_{11}+d_{21}$), the voltage $V_0$ on the compensation capacitor $e_1$ is approximately $$V_0 \approx \frac{x_0 \cdot c_{11} + x_2 \cdot c_{12}}{c_{11} + c_{12} + e_1}, \tag{8a}$$

and the output voltage $z_0$ of summer circuit 512 becomes $$z_0 \approx \frac{x_0 \cdot c_{11} + x_2 \cdot c_{12}}{c_{11} + c_{12} + e_1} \cdot \frac{g_1}{g_1 + d_{11} + d_{21}} \tag{10a}$$

In this case, $z_0$ is still a weighted summation of $x_0$ and $x_2$, and the scaling factor can be tuned in a monotonic fashion by changing the capacitance of either $e_1$ or $g_1$.

It should be noted that the implementation of both compensation capacitors $e_i$ and $g_i$ in the circuit of FIG. 5 is one of many alternative designs to control the weight coefficients of the algebraic function that the circuit implements. Some other examples may use solely series compensation capacitors $g_i$ (without using $e_i$ at all), or place the compensation capacitor $e_i$ and/or $g_i$ at different locations of the circuit. For example, $g_i$ may be coupled to the input terminals of the second group of summer circuits, for instance, with a different $g_i$ for each input terminal or for each subset of input terminals. Also, capacitors $g_i$ may physically reside in the second group of summer circuits or reside between the first and the second group of summer circuits. Further examples may apply various combinations of compensation schemes (either capacitor-based or non-capacitor-based) to introduce addition degree of freedom for control.

2.3 Example 3

FIG. 7 shows another circuit example that has similar architecture as the circuit of FIG. 5 but includes a buffer amplifier 760 (also referred to as a gain buffer) in each of the first group of summer circuits (e.g., summer circuit 712) in replace of the series compensation capacitors $g_i$ shown in FIG. 5.

In this example, the buffer amplifier 760 is coupled to the parallel compensation capacitor $e_1$ in the summer circuit 712. In some examples, the buffer amplifier is a voltage buffer that amplifies its input voltage (shown as $V_0$) by a factor of G (e.g., G≥1, 0<G<1, G<0), such that the voltage output $z_0$ provided to the subsequent summer circuit is $z_0 = G \cdot V_0$. Due to its high input impedance (e.g., much greater than the impedance of the capacitors in the summer circuit 712), the voltage buffer 760 can be viewed as effectively "isolating" the connection of summer circuit 712 from its succeeding circuit. Therefore, voltage $V_0$ can be obtained as $$V_0 \approx \frac{x_0 \cdot c_{11} + x_2 \cdot c_{12}}{c_{11} + c_{12} + e_1}$$

without having to account for the effect of $d_{11}$ and $d_{12}$. Correspondingly, voltage $z_0$ as the output of the summer circuit 712 can be obtained as $$z_0 \approx G \cdot \frac{x_0 \cdot c_{11} + x_2 \cdot c_{12}}{c_{11} + c_{12} + e_1},$$

which again is a weighted summation of circuit input $x_0$ and $x_2$.

In some of the previous circuit examples shown in FIGS. 3 and 5, without the buffer amplifier, the cascading of capacitors through multiple stages of summer circuits can cause attenuation of the magnitude of the voltage signals that can be provided by a summer circuit to its succeeding circuit. Also, due to the variations in the capacitance of the first and the second stage sampling capacitors, such variations need to be taken into account in selecting the capacitance of the compensation capacitors $e_i$ of the first stage in order for the output of each summer circuit to be uniformly scaled.

The above-described signal attenuation or distortion can be mitigated, for example, by the use of a buffer amplifier 760 with a gain G>1 that boosts the output voltage signal before it is passed onto the next stage. In some other examples where the buffer amplifier is selected to be a unity-gain buffer (i.e., G=1) such that $$z_0 \approx \frac{x_0 \cdot c_{11} + x_2 \cdot c_{12}}{c_{11} + c_{12} + e_1},$$

the signal attenuation effect may still be reduced as a result of isolating, from the summer circuit 712, the impedance effect of sampling capacitors $d_{11}$ and $d_{12}$ used in the summer circuits of the second stage.

3 Analog Computation with Negative and Complex Coefficients

In some circuit examples, for example, for DFT implementation, the $a_{mn}$ and $b_{pq}$ coefficients in equations (1a)-(1h) may have negative values and/or possibly complex values.

Figure 8:
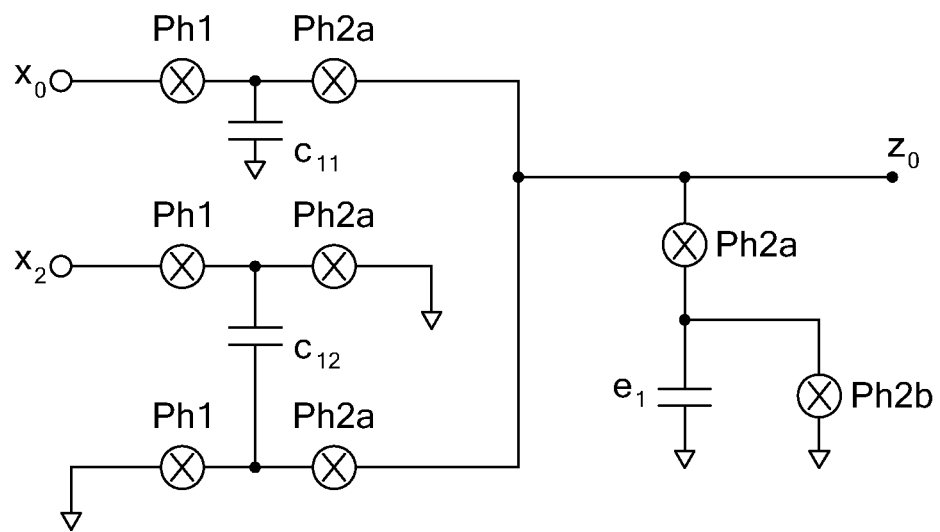
FIG. 8 shows a further embodiment of the weighted summation circuit of FIG. 1 with negative coefficients.

FIG. 8 shows one example of a summer circuit that is configured for performing summations with negative weights. In comparison with the summer circuit 112 shown in FIG. 2, in this example, sampling capacitor $c_{12}$ is switchably coupled to the input $x_0$ and output $z_0$ in a series-like configuration. During clock ph1, capacitor $c_{12}$ is charged at an amount equal to $x_2 \cdot c_{12}$. During clock ph2a, the polarity of capacitor $c_{12}$ is effectively flipped before its charge is combined with the charge stored on capacitor $c_{11}$ (i.e., $x_0 \cdot c_{11}$) to be redistributed over $c_{11}$, $c_{12}$ and $e_1$ (ignoring the impedance effect of any succeeding circuit). As a result, the output voltage $z_0$ of the summer circuit can be obtained as $$z_0 = \frac{x_0 \cdot c_{11} - x_2 \cdot c_{12}}{c_{11} + c_{12} + e_1}.$$

A summer circuit that performs summations with complex weight(s) can be configured, for example, using a pair of summers that operate on the real and imaginary parts of the summation, respectively, as will be described below.

4 Applications and Extensions

The general computation structure and the circuit implementations described above can be used in a number of applications, some of which are described below.

4.1 DFT Computations

4.1.1 Computations with Complex Values

A complex version of the circuit in FIG. 3 provides a 4-point DFT circuit that implements a two-stage complex computation of the calculation illustrated in FIG. 1.

Figure 9:
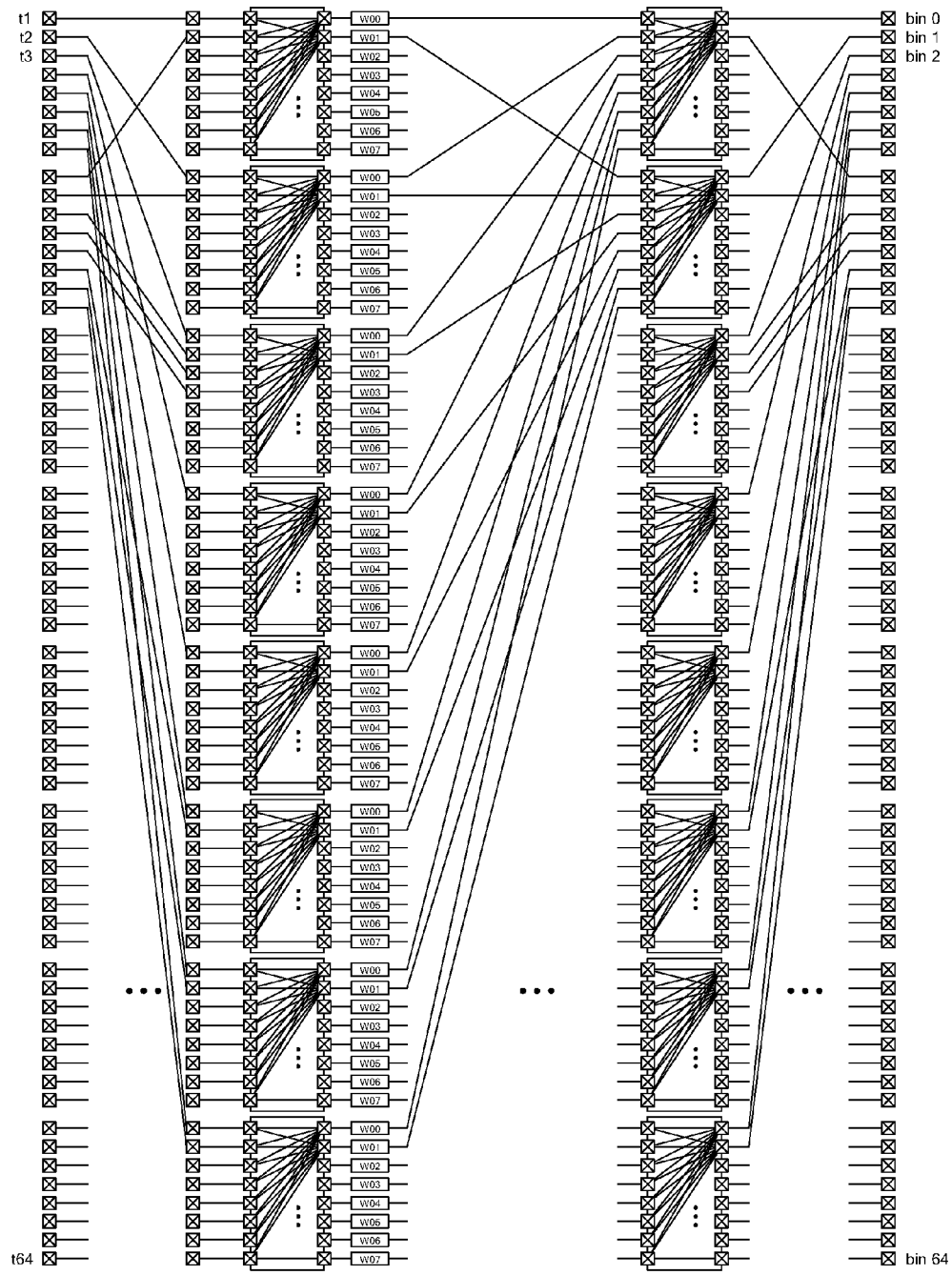
FIG. 9 shows a circuit structure that can be used to implement a 64-point FFT.

FIG. 9 shows a diagram of one implementation of a 64-point DFT using two stages of 8-point butterfly sections. In this implementation, the use of inter-stage weights ($W_{00}$, $W_{01}$, ...) allows the first and second stages to rely on identical 8-point butterfly design, and may reduce the number of multiplies needed in the circuit. The inter-stage weights can be achieved by using variable buffer amplifiers having the corresponding gains. In some other implementations that do not use gain amplifiers, the inter-stage weights may be pushed to the second stage and the butterfly design in the second stage need to be modified to reflect this change instead of using butterflies replicated from the first stage.

The circuit illustrated in FIG. 9 deals with real input values. In a complete complex DFT that accept complex inputs, the real and imaginary parts are provided as separate input signals.

Figure 10:
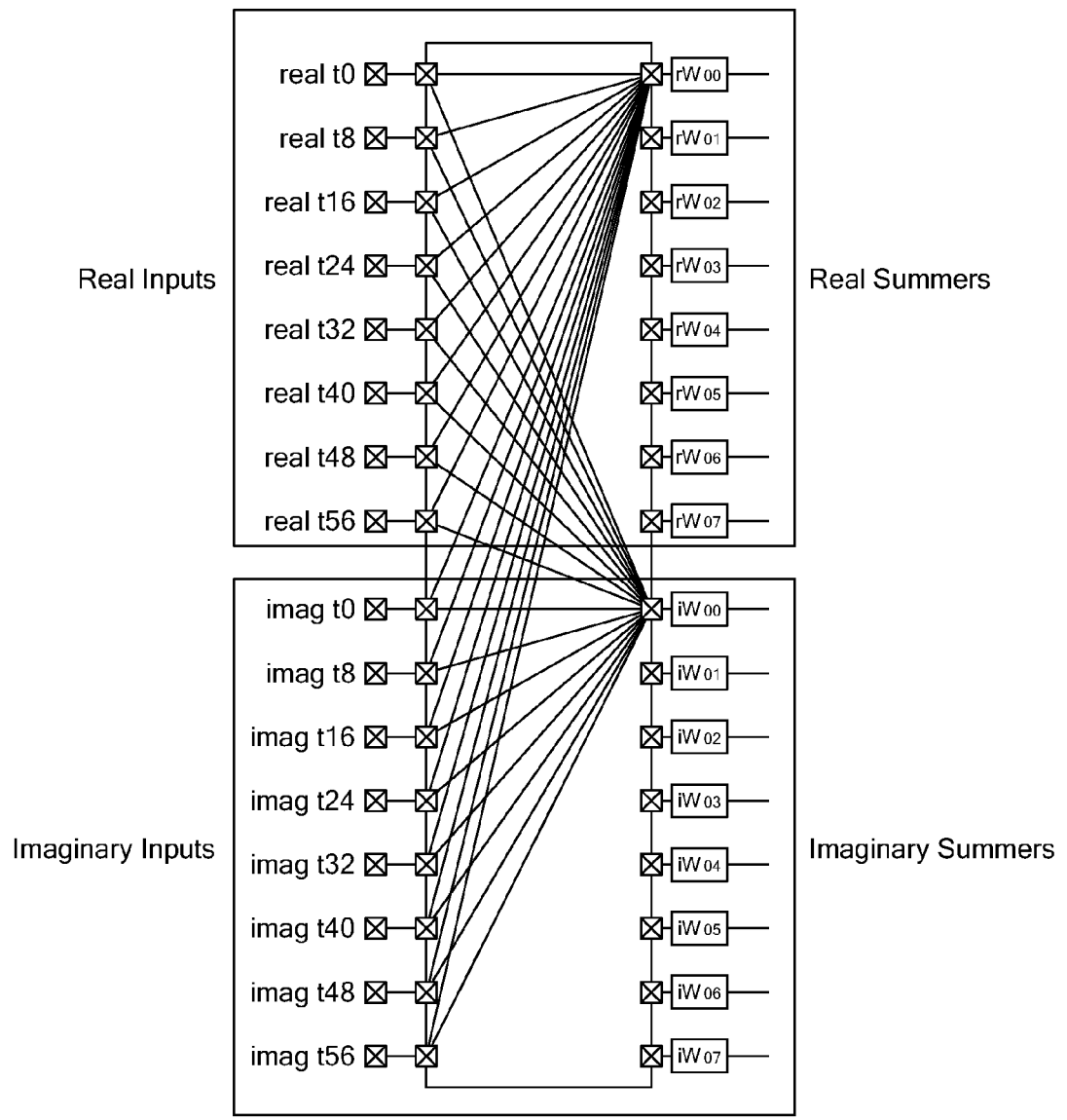
FIG. 10 shows a complex version of a block of the circuit structure of FIG. 9.

FIG. 10 shows a diagram for the computation of complex values for an 8-point butterfly section of the first stage. Here, the butterfly section includes a subsection of real summers for calculating real-valued outputs, and a subsection of imaginary summers for calculating imaginary-valued outputs. The real and imaginary summers use both real and imaginary input signals. As a result, when organizing the physical layout of a complex DFT, each subsection of a butterfly uses all of the inputs to the butterfly, both real and imaginary.

4.1.2 Single-Stage DFT Computation

In some examples, DFT implementations using single-stage computation are possible.

For example, according to equation (1), the outputs of a 4-point DFT can be directly obtained as weighted summations of the inputs as the following:

$$y_0 = w_{00} \cdot x_0 + w_{01} \cdot x_1 + w_{02} \cdot x_2 + w_{03} \cdot x_3; \quad (11a)$$

$$y_1 = w_{10} \cdot x_0 + w_{11} \cdot x_1 + w_{12} \cdot x_2 + w_{13} \cdot x_3; \quad (11b)$$

$$y_2 = w_{20} \cdot x_0 + w_{21} \cdot x_1 + w_{22} \cdot x_2 + w_{23} \cdot x_3; \quad (11c)$$

$$y_3 = w_{30} \cdot x_0 + w_{31} \cdot x_1 + w_{32} \cdot x_2 + w_{33} \cdot x_3; \quad (11d)$$

In this example, according to equation (1), all of the variables and coefficients could be complex values. When the values are complex valued the product operations of equations (11a)-(11d) would be implemented by complex circuits discussed immediately above. For purposes of illustration, only one of the four components for implementing the DFT of equations (11a)-(11d), i.e., the component operates solely on real signals, is illustrated below.

Thus, for an DFT that has N inputs and M outputs (N=M=4 in this example), a single-stage implementation can be achieved using M summer circuits each of which performs one of the computations of equations (11a)-(11d). For instance, each of the M summer circuits may be configured to include N number of sampling capacitors respectively responsive to the N inputs. Each summer circuit may be further coupled to a compensation capacitor for generating one of the M outputs. In each summer circuit that corresponds to one of the equations (11a)-(11d), the sampling capacitors can be selected to have capacitance in proportion to the $w_{uv}$ coefficients. Further, the total capacitance of capacitors in each summer circuit combined with the corresponding compensation capacitor may be selected to be equal or be set at fixed ratios for all M summer circuits such that the M outputs are all properly scaled.

4.1.3 Multi-Stage DFT Computation

In the case of two-stage or other multi-stage DFT computations, the periodicity of the circuit structure allows one to design a core module of one or more butterfly components (e.g., implemented as block 110 shown in FIG. 1) and to process signals by pipelining replicates of the core module through which the signals propagate in successive stages. To control the exact form of the computation performed at each stage, a reconfigurable circuit element (e.g., a compensation capacitor of variable capacitance, or a variable gain amplifier) may be placed inside each copy of the core modules, or be coupled between the different stages of the core modules or between iterations. In certain applications, such a design can result in a reduction in circuit complexity, hardware requirement, and circuit size.

Figure 11:
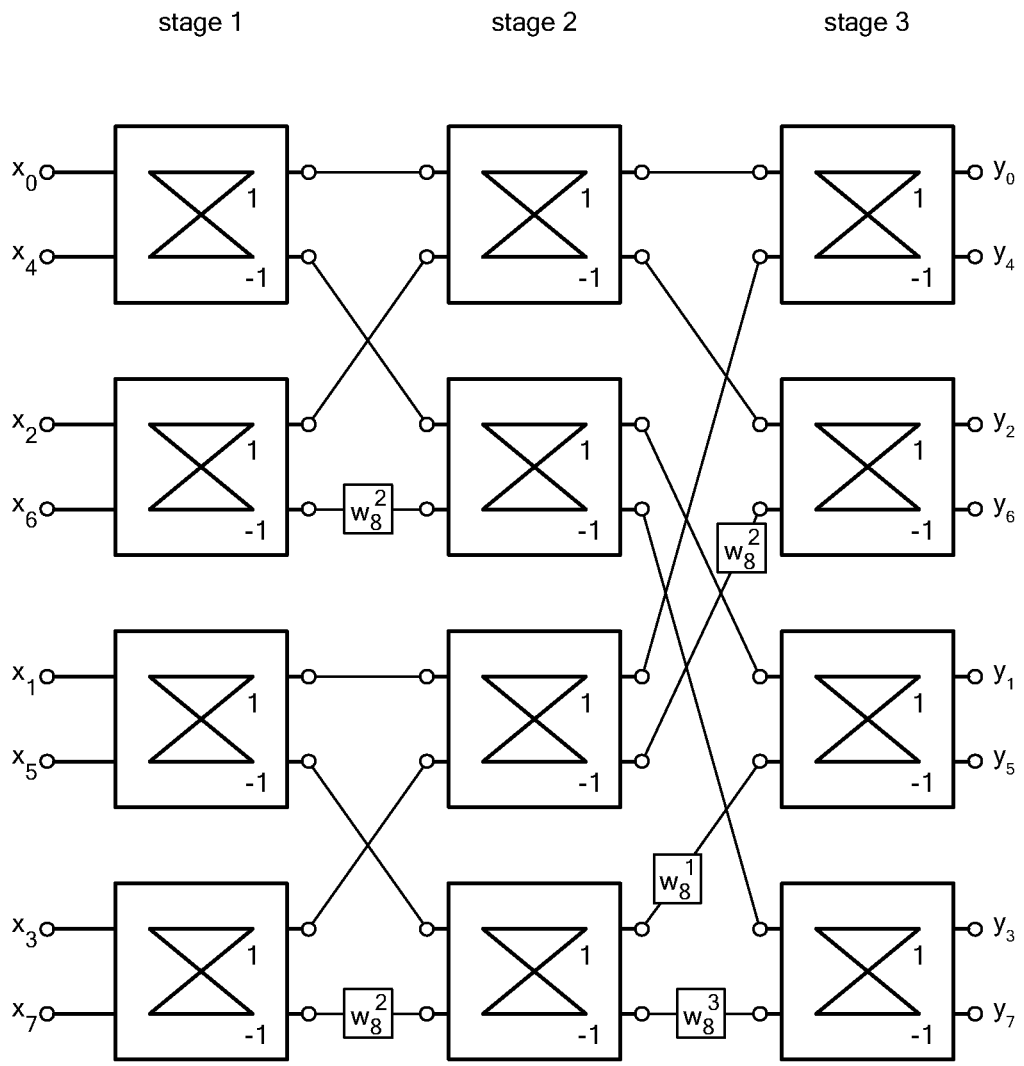
FIG. 11 shows a three-stage computation structure for a Radix-2 decimation-in-time 8-point FFT.
Figure 12:
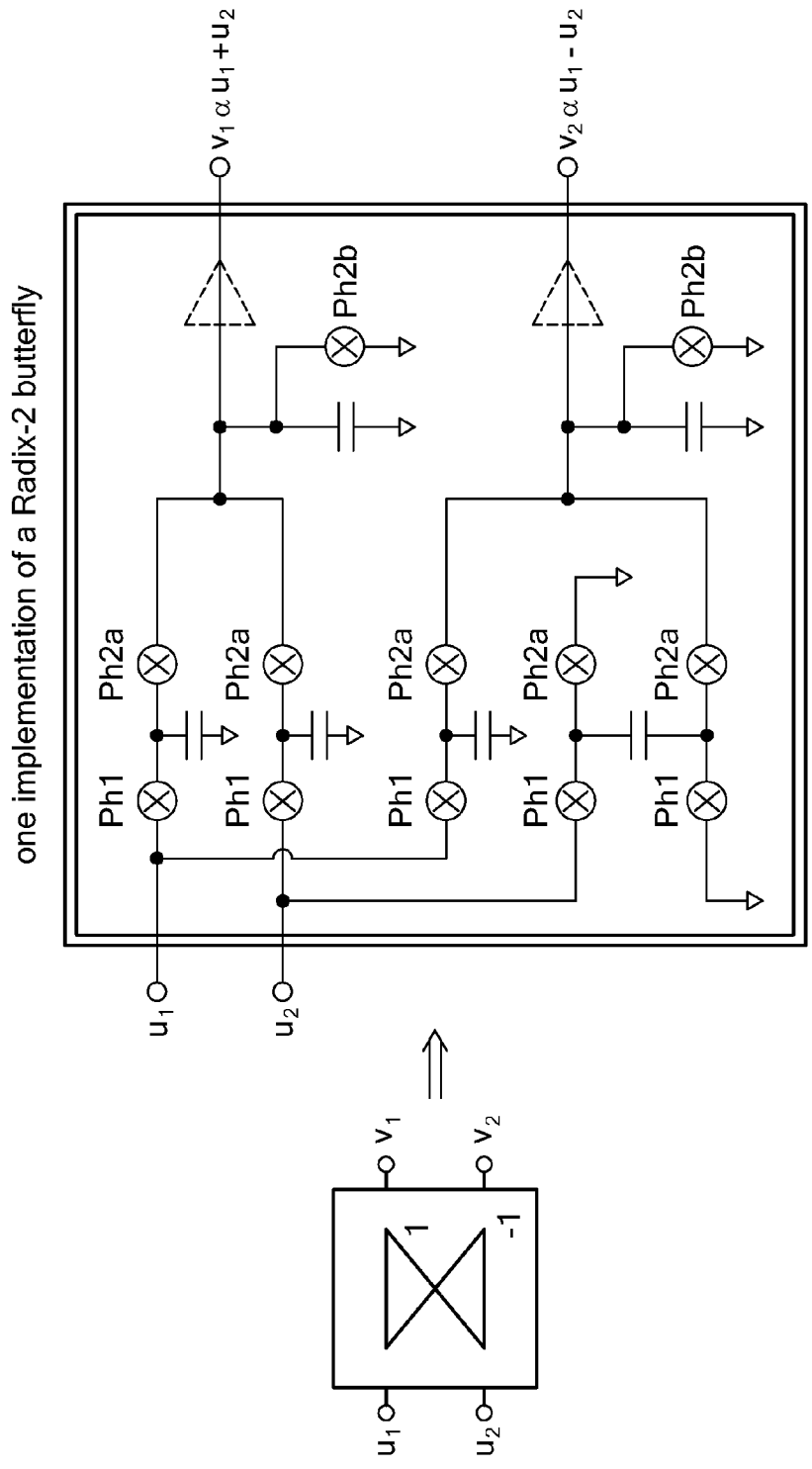
FIG. 12 shows one embodiment of the Radix-2 butterfly shown in FIG. 11.

FIG. 11 shows one example of an 8-point FFT structured using Radix-2 decimation-in-time configuration. Here, the FFT computation is partitioned into three stages, with each stage implementing 4 replicates of a Radix-2 butterfly. Each Radix-2 butterfly can be configured, for example, using a pair of switched-capacitor based summer circuits, as shown in FIG. 12. The summer circuits may include one or more of a parallel compensation capacitor, series compensation capacitor, or buffer amplifier to control the scaling of output signals, as described in the earlier sections of this document.

To ensure that each output signal has the correct form of coefficients (i.e., provides a weighted summation of input signals in prescribed ratios), a set of inter-stage gain elements (e.g., shown as $W_8^1, W_8^2$, etc.) are placed at proper locations in the circuit. Each gain element can be implemented using buffer amplifier, compensation capacitors, or other types of circuit components operable to provide such gains. In some embodiments, rather than being placed between stages, some or all of the gain elements may be incorporated in the circuit of the previous stage or the next stage.

4.1.4 Multi-Stage DFT Computation with Multiplexer

In some implementations of multi-stage DFT computations, the output signals may not be required to be read in a fully parallel manner. For instance, the sampling of individual or pairs of output signals may be scheduled according to clock signals and be sequentially stored in memory (e.g., analog memory implemented as a capacitor bank) or provided to a following circuit. In some of those cases, the last stage of sub-computations does not have to be conducted all at once in parallel modules. An alternative way is to use multiplexing techniques to selectively couple subsets of intermediate signals to a shared module, thereby allowing subsets of output signals to be generated in sequence.

Figure 13:
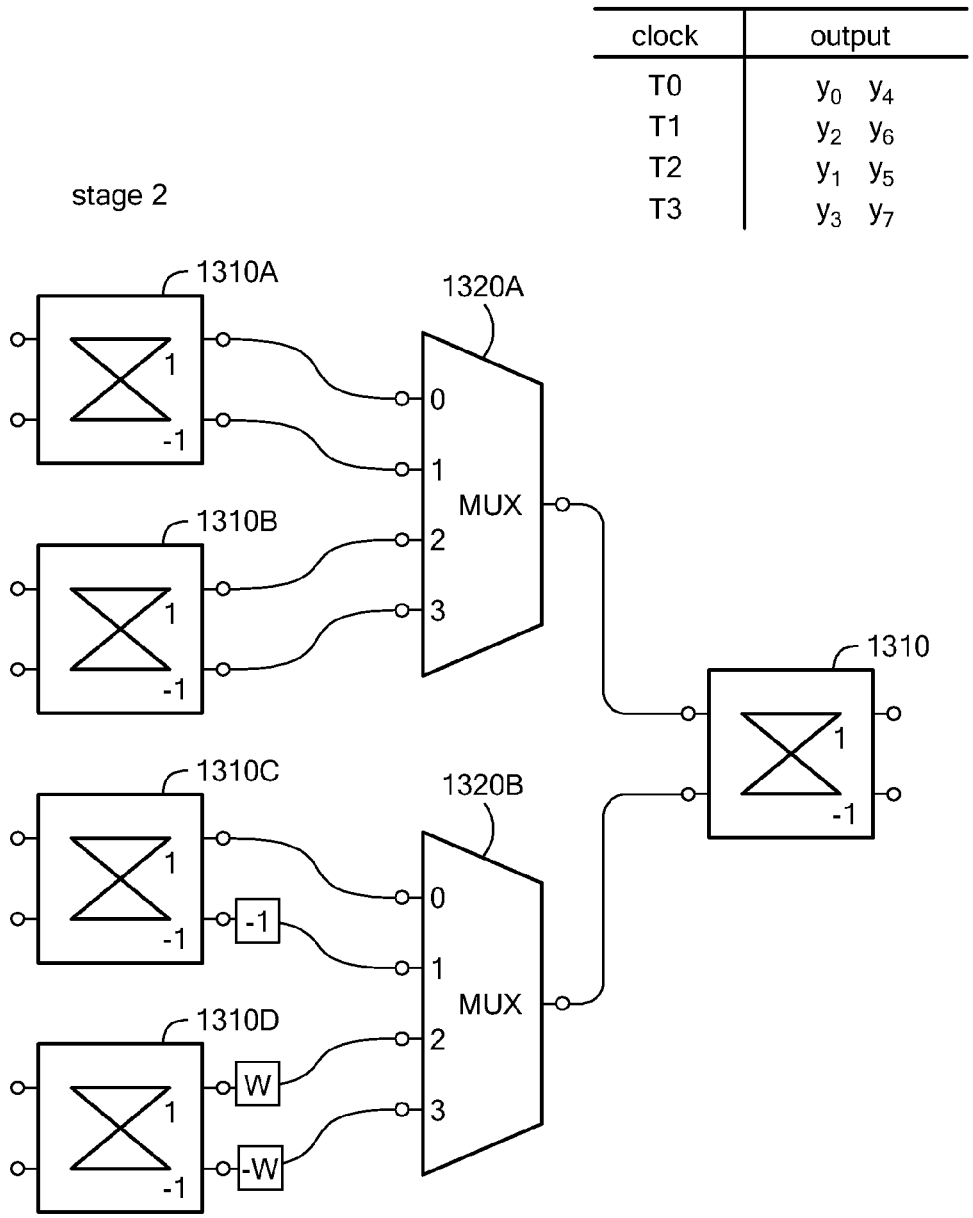
FIG. 13 shows an alternative computation structure for a Radix-2 decimation-in-time 8-point FFT using multiplexing techniques.

FIG. 13 shows such an alternative implementation of the 8-point FFT of FIG. 11. Here, the 3$^{rd}$ (last) stage of the FFT of FIG. 11 (having four Radix-2 butterflies) is replaced with a single Radix-2 butterfly 1330 and a pair of 4-input multiplexers 1320A and 1320B. The multiplexers are synchronized, by activation of clock signals, to each provide a respective one of a selected pair of inputs to butterfly 1330 to generate a corresponding pair of output signals. For instance, at clock T0, each multiplexer outputs the signal received at its input channel 0 to butterfly 1330, which subsequently produces output signals y$_0$ and y$_4$. As such, the last stage of the circuit can produce 8 output signals in 4 clocks by reusing a single butterfly component. Compared with the parallel implementation of FIG. 11, the configuration of FIG. 13 may reduce the number of core computational modules and thus circuit size, especially for large FFTs.

As described above, a reconfigurable circuit element may be placed inside or between the butterflies to control the exact form of computation performed at each stage. One example of a reconfigurable circuit element is a controllable variable capacitor.

Figure 16:
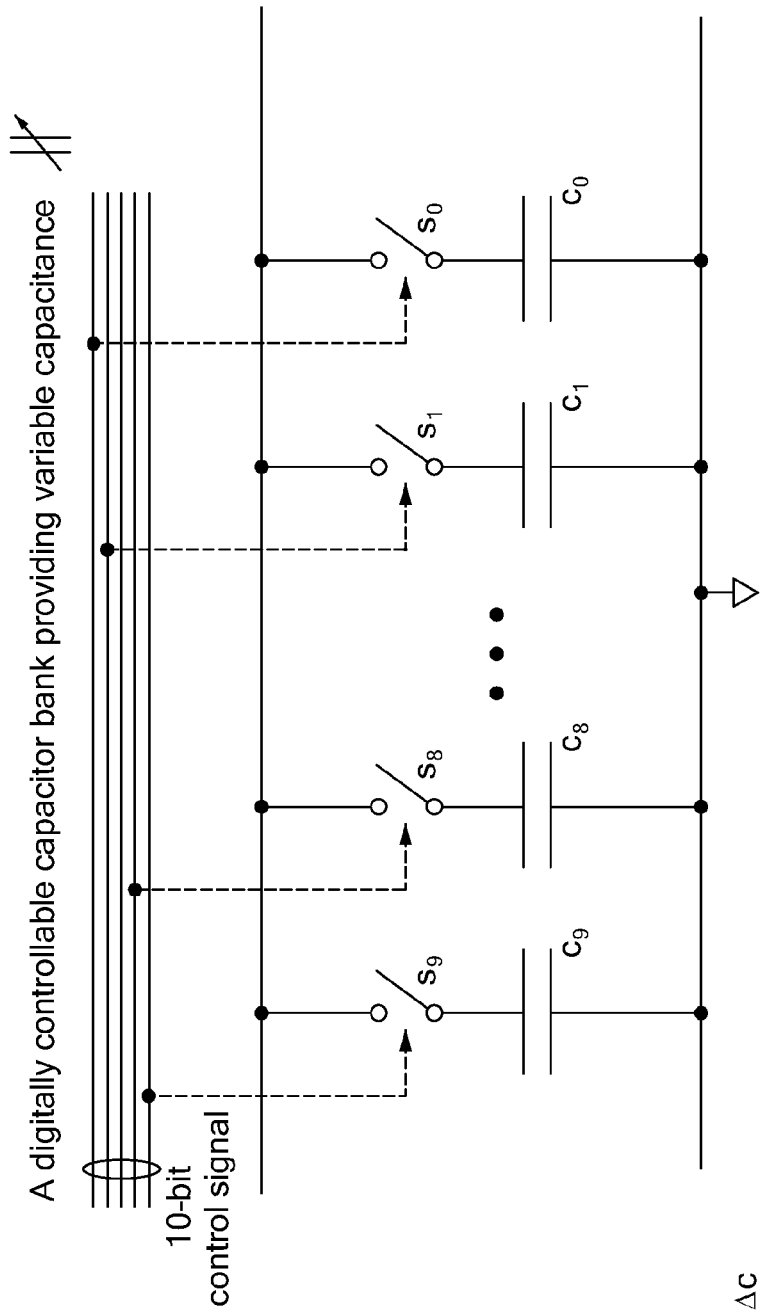
FIG. 16 shows one example of a digitally controllable capacitor bank.

FIG. 16 shows one implementation of a controllable variable capacitor that includes a digitally controllable capacitor bank. The capacitor bank includes n (n=10 in this example) capacitors coupled in parallel, with each capacitor being individually coupled to a corresponding switch. Each switch can be activated (closed) by a digital control signal. Each capacitor has a fixed capacitance, labeled as $c_i$, where i=0, 1, . . . , 9. In some examples, by selecting the capacitance $c_0$ through $c_{n-1}$ in a predetermined ratio relation in order, the fine variation of the capacitance of this capacitor bank can be achieved in a digital manner. For instance, if $c_i$ is selected such that $c_i=2^i \cdot \Delta c$, the output capacitance of this capacitor bank can be varied at the interval of $\Delta c$ from the minimum of $\Delta c$ to the maximum of $(2^n-1)\cdot\Delta c$ by use of a control signal of 10 binary digits. In some other examples, the capacitance selection of $c_i$ can be based on other schemes (e.g., not necessarily based on a power relationship).

4.2 Algebraic Computation Through Multi-Stage Sub-Computations

In addition to DFT computations, the techniques described above can be generally extended to implement various types of computations by partitioning the ultimate form of the computation into sequential sub-computations that make use of same or similar structures.

Figure 14:
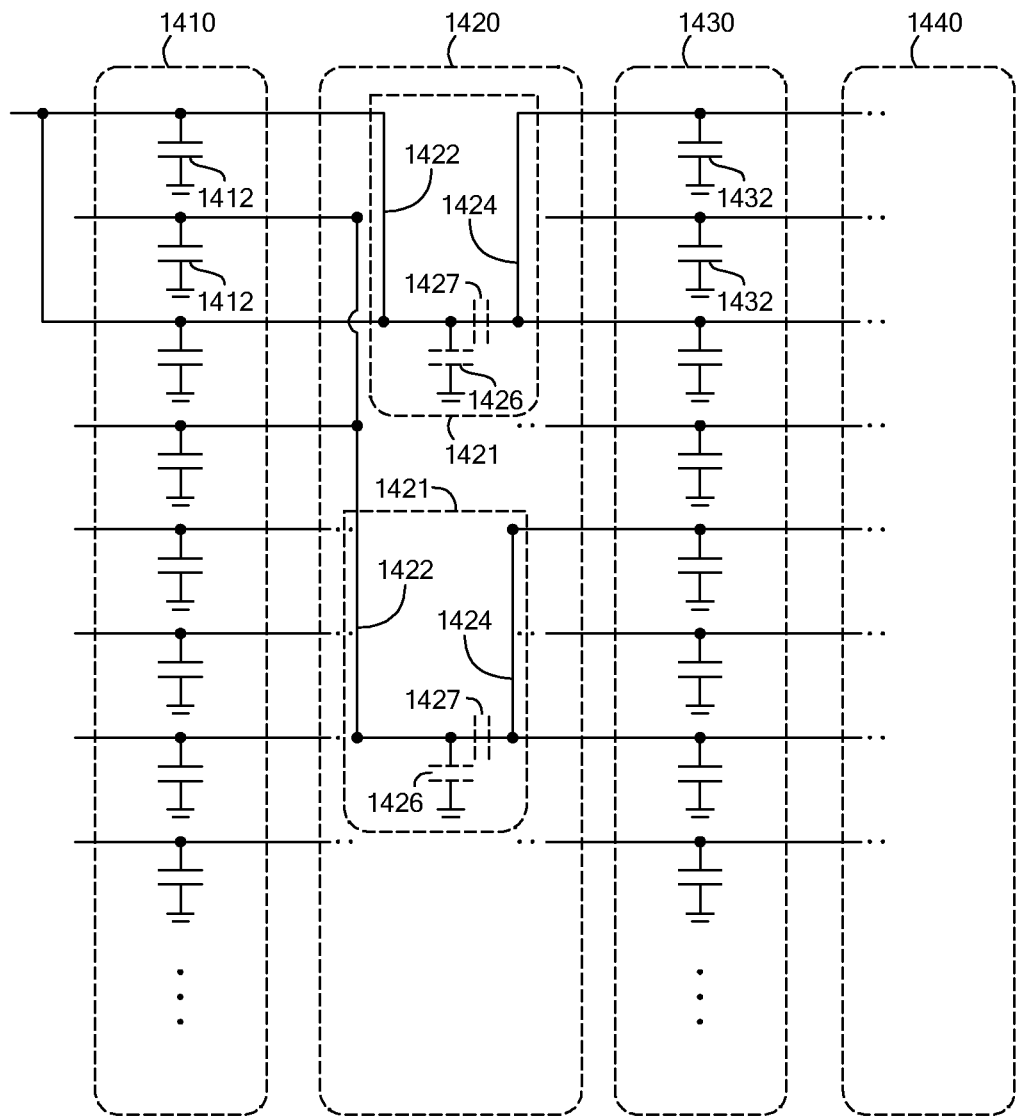
FIG. 14 shows a general computation structure for performing multi-stage divisions of an algebraic computation.

FIG. 14 shows an example of a general computation structure for implementing a prescribed computation via sequential stages. This circuit structure includes a set of storage sections 1410, 1430, etc., each having a group of storage elements (for instance, capacitors 1412, 1432) that can store data according to signals received at its input terminal. The circuit also includes a set of interconnection sections 1420, 1440, etc., each configured for switchably coupling subsets of storage elements from a corresponding pair of neighboring storage sections for implementing a desired mathematical operation (e.g., weighted summation), for example, by way of charge sharing.

In some examples, each interconnection section such as section 1420 includes a set of pre-configured connection modules 1421, each module having an input bus 1422, an output bus 1424, and one or more compensation elements (e.g., parallel compensation capacitor 1426 and/or series compensation capacitor 1427) coupled between the two buses. The interconnection section 1420 also includes switches for coupling subsets of storage elements from storage sections 1410 and 1430 respectively onto the input and output buses of a corresponding connection module 1421, for example, to perform a weight summation of a particular form. (For the purpose of simplicity, phase clocks or time-controlled switches used in the circuit are not shown in the figure).

Depending on the particular implementations, the connection modules 1421 may be configured to provide a set of predetermined compensation schemes (e.g., each module with a fixed different compensation gain) for selection according to the weight coefficients of the desired computation. Alternatively, some connection modules 1421 may provide reconfigurable compensation schemes, for example, by use of variable compensation capacitors that can change capacitance values (and thus the compensation gains) in response to external control signals.

By partitioning the circuit structure into two functional regimes—storage sections and interconnection sections, the circuit can be physically implemented by alternating or re-using replicates of the two sections in a number of ways, as further illustrated below.

Figure 15A:
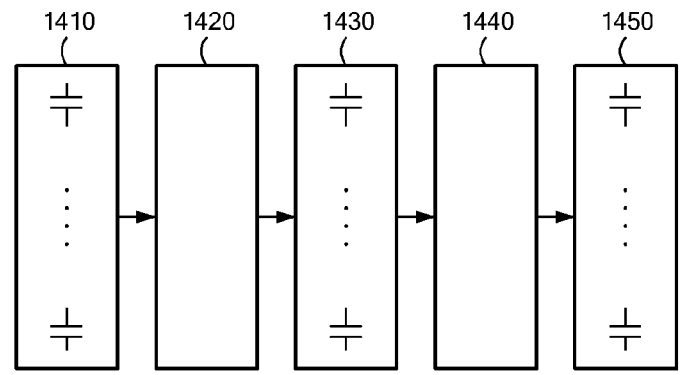
FIGS. 15A-15C show various computation structures for performing multi-stage divisions of an algebraic computation.

FIG. 15A shows one example of a circuit having a set of storage sections 1410, 1430, 1450 interleaved in series with a set of interconnection sections 1420, 1450, etc. Each storage section has a group of capacitors, for example, coupled in series. To perform sequential sub-computations, the interconnection sections are individually activated in successive stages to enable charge sharing between selectively coupled capacitors in the two neighboring storage sections coupled by the interconnection section. Upon completion of the computation, signals representing the computation results are provided, for example, at the output terminals of the last storage section (in this example, 1450) for retrieval.

Note that for certain computations that proceed through a large number of computation stages, it may not be required to have for every stage a designated physical implementation (or to carry out a uni-directional signal flow). For instance, one may construct a small set of re-usable storage and interconnection sections and direct the signal flow through the sections in an iterative manner in order to reduce the hardware requirements and the physical size of the actual circuit.

Figure 15B:
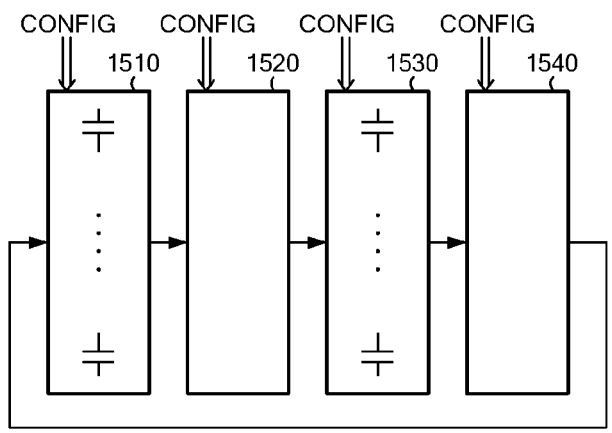

FIG. 15B shows such an example having a combination of two storage sections 1510, 1530 and two interconnection sections 1520, 1540 capable of performing a multi-stage computation over a series of two-stage cycles. At the end of each cycle, the output of the cycle is provided by interconnection section 1540 back to the input terminals of the first storage section 1510 as the input of the next cycle. In order to allow different computations be performed in different cycles, the particular configuration of the four reusable sections 1510-1540 (e.g., the connections of capacitors in storage section 1510, the gain and the bus configuration of the individual modules in the interconnection section 1520) can be controlled by external signals.

Figure 15C:
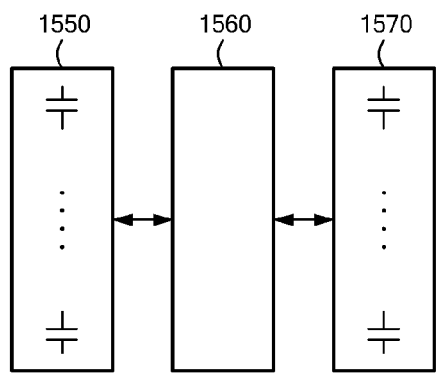

FIG. 15C shows a further example that implements multi-stage computations through bi-directional charge sharing among the capacitors in two storage sections 1550. By use of a programmable interconnection section 1560, charge sharing occurs in one cycle between a selected pair of subsets of capacitors from the two storage sections 1550 and 1570, and in the next cycle, occurs between a different pair of subsets of capacitors from the two storage sections. Such a design can greatly reduce the number of circuit elements required for completing the computation.

In some embodiments, each storage section and/or interconnection section shown in FIGS. 15A-15C can be a generic circuit that can be configured by applying personality data. For instance, after fabrication, the generic circuit can be configured (either dynamically or statically) by external data to function as some of the circuits shown in FIGS. 1-14.

Note that the approaches described above may be applied to other analog computations, for instance, computations that involve weighted sums of signal values. One such example implements a Finite Impulse Response (FIR) filter, which can be expressed as $$y(n) = \sum_{k=0}^{K-1} h_k x(n-k).$$

In one implementation, K capacitors (numbered 0 through K−1) are used in a first storage section, and that storage section has an output buffer coupled to each capacitor. On input, an input value x(i) is coupled to capacitor i mod K. Then capacitors in a second storage section of K capacitors are coupled to the capacitors in the first storage section such that at time i, capacitor k in the second storage section is coupled to capacitor (i−k) mod K in the first storage section. The capacitor values in the second storage section are selected such that the $k^{th}$ capacitor value $c_k$ is proportional to $h_k$.

In another implementation, $K^2$ capacitors (doubly indexed (0,0) through (K−1, K−1)) are used in a single storage section. An input x(i) is coupled to multiple capacitors (i mod K, 0) . . . , (i mod K, K−1) such that they are all charged based on the same input. Then, an output y(i) is formed by coupling capacitors (i mod K, 0), (i−1 mod K,1), . . . , (i−K+1 mod K, K−1), optionally with an output capacitor or a capacitor in another storage section. The FIR filter equation shown above is achieved my making the $(j,k)^{th}$ capacitor value $c_{(j,k)}$ have a value that is proportional to $h_k$.

5 Alternative Embodiments

In the above description, for purposes of simplicity, circuit capacitors are described as sampling and compensation capacitors, each of which may be formed using conventional techniques such as by displacing an insulating, or dielectric, layer between two conducting layers, or using reverse bias diodes. In other examples, circuit capacitors may also include capacitive and/or parasitic elements (e.g., also including the effective capacitance of various interconnection elements in the circuit) that store charges in a similar manner as conventional capacitors.

In some examples, some (or all) of the capacitors used in the circuit may be reconfigurable capacitors with variable capacitance that changes, for example, based on selectable capacitor banks where subsets of the capacitors are selected according to control signals, or by sending control signals to voltage controlled variable capacitors such as a varactor device. This reconfigurability of capacitors (in particular, the reconfigurability of the compensation capacitors) allows the circuit to be tuned to set the scaling factors such as $K^{(1)}$ and $K^{(2)}$ as desired. This reconfigurability of capacitors also allows the circuit to be tuned to set different weighting factors for other mathematical transforms.

Although input signals are illustrated as voltage encoded signals in FIGS. 3 and 4A-4D, in other examples, alternative forms of signals (such as current encoded signals) may also be used. The circuit may be configured to be responsive to input in either single-ended mode, or alternatively, in differential mode. In addition to using capacitors/capacitive elements in constructing the summer circuits shown in FIG. 3, more generally, other types of energy storage elements (such as inductors and superconductors) can also be configured for storing and redistributing energy in a manner similar to the summer circuits described above.

The methods and systems described can be implemented for a single computation, or alternatively, for sequential operations. For example, the circuit of FIG. 3 can be used as one component of an DFT module, a stand-alone DFT module, or an DFT module that is integrated into a larger computation that, in some cases, may perform iterative operations on this DFT module. In addition to performing DFT computations, the methods and systems described here can also be used for implementing other forms of computations such as various algebraic functions. One example relates to weighted summations having forms similar to equation (1) but with multiple scaling factors, each corresponding to a respective output $y_k$. For example, the scaling factors $K^{(1)}$ and $K^{(2)}$ described in some examples above may be configured to be specific to each output $y_k$, rather than being constant for all outputs. In some cases, one or more of the scaling factors may also be varied as desired during circuit operation, for example, using reconfigurable capacitors.

In some examples, the circuits described above form part of one or more integrated circuits. For example, other parts of the integrated circuit(s) may include input and output sections for accepting and providing analog and/or digital data. In some examples, data representing the circuits is provided on computer-readable media as instructions or other data that allows a circuit design or layout system to incorporate a specification of the circuit in a specification for an integrated circuit, for example, as a reusable circuit core.

In some embodiments, the operation of the circuits, for example, as shown in FIGS. 4A-4D may be clocked at a frequency suitable for analog frequency applications. In some other embodiments, the operation of the circuits may be clocked at a frequency suitable for radio frequency (RF) applications. In some RF applications, the sampling capacitors may be loaded (charged) by a band-limited signal according to the bandwidth characteristics of the signal.

It is to be understood that the foregoing description are intended to illustrate and not to limit the scope of the invention.

Other embodiments are within the scope of the following claims.

What is claimed is:

1. A signal processing device comprising a first discrete time analog signal filter section, said first filter section comprising:
    an input circuit for accepting a time series of input signal values;
    an output circuit for providing a time series of output signal values;
    a first analog signal storage section comprising a plurality of capacitors;
    switching circuit elements configurable to controllably interconnect the capacitors;
    control logic for controlling configuration of the switching circuit elements in a sequence of configurations for each successive value of the input time series to form the time series of output signal values as an application of a desired filter to the time series of input signal values;
    wherein the sequence of configurations for an input signal value includes
        a first configuration in which each capacitor of a first plurality of the capacitors is charged via a first selected subset of the switching circuit elements to a charged state proportional to the input signal value,
        a second configuration in which each capacitor of a second plurality of capacitors is coupled by a second selected subset of the switching circuit elements to permit bidirectional charge redistribution between said capacitors, said capacitors including capacitors each charged prior to being coupled to a state proportional to a different signal value of the time series of input values, and
        a third configuration in which each capacitor of a third plurality of the capacitors is coupled by a third selected subset of the switching circuit elements to the output circuit for forming an output value according to a charged state of the third plurality of capacitors.

2. The signal processing device of claim 1 wherein the input circuit is for accepting the time series of input values as voltage input values, and wherein each capacitor of the first plurality of capacitors is charged to a voltage state proportional to a voltage input value.

3. The signal processing device of claim 1 wherein the output circuit is for forming the output value proportional to a total charge on the third plurality of capacitors.

4. The signal processing device of claim 3 wherein the output value is a voltage output value proportional to a total charge on the third plurality of capacitors.

5. The signal processing device of claim 1 wherein the third plurality of capacitors is the same as the second plurality of capacitors.

6. The signal processing device of claim 1 wherein the desired filter to the time series of input signal values comprises a finite impulse response (FIR) filter, and wherein the capacitors each charged to a state proportional to a different signal value of the time series of input values are further charged to a state proportional to a scale value corresponding to said different signal value.

7. The signal processing device of claim of claim 6 wherein the FIR filter implements $$y(n) = \sum_{k=0}^{K-1} h_k x(n-k),$$

where x(n) represents the time series of input values, y(n) represents the time series of output values, and $h_k$ represents a scale value corresponding to an input signal value x(n−k), and wherein each capacitor of the second plurality of capacitors is charged to a state proportional to a different one of the terms $h_k x(n-k)$.

8. The signal processing device of claim 1 wherein:
    the plurality of capacitors comprises $K^2$ capacitors, $K \geq 2$;
    the first plurality of capacitors comprises a first set of K capacitors; and
    the second plurality of capacitors comprises a second set of K capacitors different than the first set of capacitors.

9. The signal processing device of claim 7 wherein the K capacitors of the first plurality of capacitors have capacitances proportional to $h_0, k_1, \ldots, k_{K-1}$ representing a characteristic of the desired filter.

10. The signal processing device of claim 1 configured according to the desired filter.

11. The signal processing device of claim 1 wherein the controller is configurable according to external control signals representing characteristics of the desired filter.

12. The signal processing device of claim 1 wherein the plurality of capacitors comprise at least some variable capacitors configurable according to characteristics of the desired filter.

13. The signal processing device of claim 1 wherein the plurality of capacitors comprises groups of capacitors of multiple different capacitances configurable to set a desired capacitance for the group.

14. The signal processing device of claim 1 wherein the input for accepting the input signal values comprises an input for accepting differential signal values.

15. The signal processing device of claim 1 further comprising a second filter section, and wherein an output signal value of the first filter section provides an input to the second filter section.

16. The signal processing device of claim 1 further comprising a second analog storage section, and wherein in the third configuration the capacitors of the third plurality of capacitors are coupled to at least one capacitor of the second storage section.

17. The signal processing device of claim 1 embodied in an integrated circuit.

18. The signal processing device of claim 1 configured to accept and filter audio frequency input signal values.

19. The signal processing device of claim 1 configured to accept and filter radio frequency input signal values.

20. A method for signal processing an input signal to form an output signal device as an application of a desired filter to the input signal, the method comprising:

accepting a time series of input signal values;

controlling switching circuit elements to interconnect the capacitors of a first analog storage section in a sequence of configurations for each successive value of the input time series to form a time series of output signal values as an application of a desired filter to the time series of input signal values; and providing the time series of output signal values;

wherein the sequence of configurations for an input signal value includes
- a first configuration in which each capacitor of a first plurality of capacitors is charged via a first selected subset of the switching circuit elements to a charged state proportional to the input signal value,
- a second configuration in which each capacitor of a second plurality of capacitors is coupled by a second selected subset of the switching circuit elements to permit bidirectional charge redistribution between said capacitors, said capacitors including capacitors each charged prior to being coupled to a state proportional to a different signal value of the time series of input values, and
- a third configuration in which each capacitor of a third plurality of the capacitors is coupled by a third selected subset of the switching circuit elements to the output circuit for forming an output value according to a charged state of the third plurality of capacitors.

* * * * *